US006336088B1

(12) United States Patent
Bauman et al.

(10) Patent No.: US 6,336,088 B1
(45) Date of Patent: Jan. 1, 2002

(54) METHOD AND APPARATUS FOR SYNCHRONIZING INDEPENDENTLY EXECUTING TEST LISTS FOR DESIGN VERIFICATION

(75) Inventors: Mitchell A. Bauman, Circle Pines; Douglas H. Bloom, White Bear Township; Joseba M. Desubijan, Minneapolis; Larry L. Byers, Apple Valley, all of MN (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/218,812

(22) Filed: Dec. 22, 1998

(51) Int. Cl.[7] .............................................. G06F 17/50
(52) U.S. Cl. ................................. 703/15; 14/16; 716/4; 716/7
(58) Field of Search .............................. 703/14, 15, 16, 703/22; 716/1, 4, 7

(56) References Cited

U.S. PATENT DOCUMENTS

| 5,493,672 A | * | 2/1996 | Lau et al. ...................... 703/21 |
| 5,633,813 A | * | 5/1997 | Srinivasan .................... 703/14 |
| 5,790,836 A | * | 8/1998 | Mizuno ........................ 703/22 |
| 5,867,691 A | * | 2/1999 | Shiraishi ...................... 713/400 |
| 6,006,022 A | * | 12/1999 | Rhim et al. ..................... 716/1 |
| 6,117,181 A | * | 9/2000 | Dearth et al. ................. 703/22 |
| 6,212,489 B1 | * | 3/2001 | Klein et al. ................... 703/13 |

OTHER PUBLICATIONS

Kormicki et al., "Parallel Logic Simulation on a Network of Workstations Using PVM", Eighth IEEE Symposium on Parallel and Distributed Processing, pp. 2–9, Oct., 1996.*

* cited by examiner

Primary Examiner—Kevin J. Teska
Assistant Examiner—Douglas W. Sergent
(74) Attorney, Agent, or Firm—Charles A. Johnson; Mark T. Starr; Nawrocki, Rooney & Sivertson, P.A.

(57) ABSTRACT

Method and apparatus for synchronizing the execution of the two or more test lists at desired synchronization points, while allowing the test lists to execute in a non-deterministic manner between the synchronization points is disclosed. A test driver is provided for executing each test list, and a run controller is provided for monitoring the execution of each test list. To synchronize the execution of the two or more test lists, the run controller halts the execution of each test list as each test driver assumes a predetermined state. Once all of the test lists are halted, the test lists are synchronized. Once synchronized, selected test drivers are restarted to continue execution of the corresponding test lists in a relatively non-deterministic manner.

20 Claims, 14 Drawing Sheets

SUB-PROCESSING MODULE (SUB-POD)

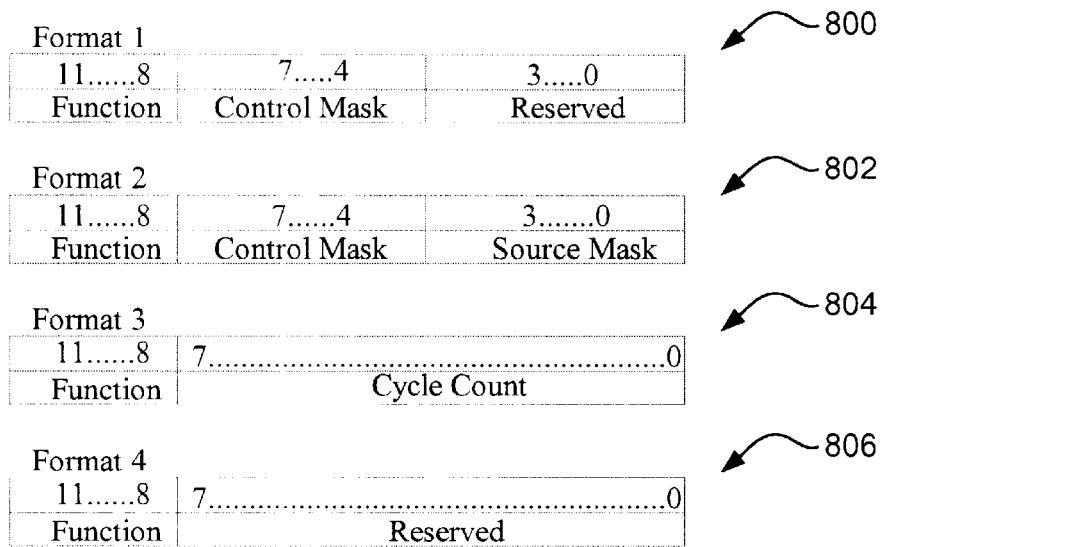

| Format 1 | | | |
|---|---|---|---|
| 11......8 | 7.....4 | 3......0 | |
| Function | Control Mask | Reserved | ← 800 |

| Format 2 | | | |
|---|---|---|---|
| 11......8 | 7.....4 | 3......0 | |
| Function | Control Mask | Source Mask | ← 802 |

| Format 3 | | |
|---|---|---|
| 11......8 | 7..............0 | |
| Function | Cycle Count | ← 804 |

| Format 4 | | |
|---|---|---|
| 11......8 | 7..............0 | |
| Function | Reserved | ← 806 |

FIG. 9

| Function Name | Compiler Code | Binary Code | Control Type | Format |
|---|---|---|---|---|
| Halt RCPD | rcpd_halt | 0000 | RCPD | 4 |
| Short Wait | rcpd_swait | 0001 | RCPD | 3 |
| Long Wait | rcpd_lwait | 0010 | RCPD | 3 |
| Step | rcpd_step_pd | 0011 | PPD | 2 |
| Resume | rcpd_resume_pd | 0100 | PPD | 2 |
| Start | rcpd_start_pd | 0101 | PPD | 1 |
| Stop | rcpd_stop_pd | 0110 | PPD | 1 |
| Reserved | - | 0111 | - | - |
| Set Hold PR | rcpd_shold_pr | 1000 | PPD | 1 |
| Clear Hold PR | rcpd_chold_pr | 1001 | PPD | 1 |
| Set Hold R | rcpd_shold_r | 1010 | PPD | 1 |
| Clear Hold R | rcpd_chold_r | 1011 | PPD | 1 |
| Reserved | - | 1100 | - | - |
| Reserved | - | 1101 | - | - |
| Reserved | - | 1110 | - | - |
| Halt PPD | rcpd_halt_pd | 1111 | PPD | 1 |

FIG. 10

METHOD AND APPARATUS FOR SYNCHRONIZING INDEPENDENTLY EXECUTING TEST LISTS FOR DESIGN VERIFICATION

CROSS-REFERENCE TO RELATED APPLICATIONS

This invention is related to U.S. patent application Ser. No. 09/218,384, filed Dec. 22, 1998, entitled "Method And Apparatus For Efficiently Generating Test Input For A Logic Simulator"; U.S. Pat. No. 6,226,716, filed Dec. 22, 1998 entitled "Test Driver For Use In Validating A Circuit Design"; U.S. patent application Ser. No. 09/219,285, filed Dec. 22, 1998, entitled "Method And Apparatus For Selectively Displaying Signal Values Generated By A Logic Simulator"; U.S. patent Application Ser. No. 08/965,004, filed Nov. 5, 1997, entitled "A Directory-Based Cache Coherency System"; U.S. Pat. No. 6,014,709, filed Nov. 5, 1997, entitled "Message Flow Protocol for Avoiding Deadlocks"; U.S. patent application Ser. No. 09/001,588, filed Dec. 31, 1997, entitled "High-speed Memory Storage Unit for a Multiprocessor System Having Integrated Directory and Data Storage Subsystems"; and U.S. patent application Ser. No. 09/001,592, filed Dec. 31, 1997, entitled "High-Performance Modular Memory System with Crossbar Connections", all assigned to the assignee of the present invention and all incorporated herein by reference.

TECHNICAL FIELD

This invention relates to the field of logic simulation of electronic circuits. More particularly, this invention relates to methods and apparatus for synchronizing independently executing test lists at selected synchronization points during a logic simulation.

BACKGROUND OF THE INVENTION

Gordon Moore, the cofounder of Intel Corporation, made an observation and prediction that semiconductor performance would double every 18 months, with the price of the new product remaining constant with the old. This observation is now referred to as Moore's Law, and has remained relatively accurate since the early 1970s. Moore's Law illustrates the rapid advancement that has and is taking place in the electronics industry. Because of this rapid advancement, the market window for many electronic products is relatively short, with faster and more powerful devices being continuously introduced. Accordingly, there is great pressure to reduce the development time for many products. To significantly reduce the development time for most electronic devices, the design time must be reduced, as the design process typically consumes a majority of the development cycle.

FIG. 1 shows a typical prior art design process for an ASIC (Application Specific Integrated Circuit) device. ASIC devices are commonly used to implement large and/or high performance circuit designs. In a first step, a hardware architect typically determines the requirements for the circuit design and formulates an underlying framework of the function and projected performance characteristics of the circuit design. The architect documents these ideas in a functional specification, as shown at step 12.

The design is then partitioned into a number of blocks and given to one or more logic designers for implementation. The logic designers create a detailed logic design using the functional specification as a guide. Rather than creating schematics, many logic designers express their design in a behavioral language such as VHDL (VHSIC Hardware Description Language), as shown at step 14. Many logic simulation tools can directly accept behavioral language descriptions as input. This not only improves efficiency in developing complex circuit designs, but also allows various sections of the circuit design to be functionally verified before the entire design is complete.

Next, and as shown at step 16, the design is typically logically simulated to verify the functionality thereof. To logically simulate the design, the circuit designer typically provides one or more test input files. The test input files may include a number of test conditions expressed as test vectors or the like. Each of the test vectors may include a value for selected inputs of the circuit design along with an expected circuit response. The logic simulator reads the test input files, simulates the behavior of the circuit design using the test input, and provides a simulated circuit response. The simulated circuit response is then compared to the expected circuit response to determine if the circuit design provides the expected behavior.

After logic simulation is complete, the design is typically passed to one or more physical designers, as shown at step 18. The physical designers place the various cells that represent the basic logic building blocks of the circuit design, and interconnect the cells using a routing tool. Timing information may be extracted and analyzed by both the physical and logical designers. Some timing problems can be fixed by the physical designer by adjusting the drive strengths of various components or placing cells in a different arrangement relative to each other. As shown at step 22, other timing problems can only be resolved by modifying the logic itself. If a problem is resolved by modifying the logic, the modified design must typically be re-verified by re-executing logic simulation step 16 and then the physical design step 18.

After all the logical and physical changes are made, and the design meets the stated requirements, the design is released for fabrication, as shown at step 24. Fabrication can take several months for a typical ASIC device. Once completed, the device is returned and tested, as shown at step 26. If the device does not meet the stated requirements, a design modification may be required as shown at step 22, forcing another design iteration of the logic simulation step 16, the physical design step 18, and the fabrication step 24. Once the device meets all of the stated requirements, the device is released, as shown at step 30.

In most design processes, it is important to reduce the number of design iterations required during the development cycle. One way of reducing the number of design iterations is to increase the fault coverage of the test input files used during the logic simulations. Increasing the fault coverage can increase the probability that all design errors will be detected before the design is fabricated. However, increasing the fault coverage increases the time required to generate and simulate the increased number of test cases. Thus, there is often a trade-off between an increased fault coverage and the design cycle time.

FIG. 2 illustrates a prior art logic simulation process. At step 42, the architect and test designer discuss the logic implementation and define a series of test cases that address the various functional sections and possible interactions of the design. In many designs, such as a MSU (Main Storage Unit) design with multiple parallel ports and crossbar switches (see below), there are many possible functional operations and interactions that could and should be tested.

Thus, a large number of test cases are often required to achieve a high level of fault coverage.

For some of the test cases, the test designer can easily define the relevant test parameters. For other test cases, however, such as those that test the parallel nature of the operating hardware, the test designer must use a certain level of parallel thinking. These tests can be more difficult to define. For example, in a test case that simulates the interaction of two parallel operating ports of a MSU module of a large scale symmetrical multiprocessor system, the operation of one port may have to be choreographed with the operation of another port to achieve a desired result. Defining such test cases can require a significant amount of parallel thinking, and can be relatively difficult and time consuming to define.

Once the test cases are defined, the test designer often codes the test cases into a format that can be used to produce an input for the logic simulator. This format may include, for example, a force command, followed by a run command, followed by a force command, etc. Test cases written in this format typically must be interpreted by the logic simulator, and more particularly, a simulation control program of the Logic Simulator. The simulation kernel must usually be interrupted before the simulation control program can process a subsequent line in the coded test case. Because the simulation kernel must be interrupted, the speed of the logic simulation can be significantly reduced.

To increase the speed of the logic simulation, a test driver may be used. A test driver is typically expressed using a behavioral language description and simulated along with the circuit design. Because the test driver can actually be simulated along with the circuit design, the test driver can stimulate the inputs of the circuit design without having to be interpreted by a simulation control program, and thus without having to interrupt the simulation kernel.

Prior to simulation, test data can be loaded into a memory structure incorporated into the test driver. The test data is used to control the inputs of the circuit design during subsequent logic simulation. For example, test data may be loaded into a RAM structure within the test driver, and during logic simulation, the address to the RAM structure may be incremented to provide each of the test vectors to the inputs of the circuit design.

To generate the test data, a test designer may code the desired test cases into a standard programming language like "C", as shown at step 44. When executed, the "C" programs may generate a series of data files that can be loaded into memory structures within the test driver, as shown at step 46. The "C" programs may also generate corresponding initialization files that can be loaded into the device under test (e.g. MSU RAMs). During simulation, a series of load commands may then be executed by the simulation control program. These load commands load the data and initialization files into the array structures that represent the simulation models of the appropriate memory structures (e.g. RAMs). Clocks are then issued (simulation starts), and the test is performed as shown at 48.

During or at the end of the logic simulation, the results are checked to see if the test passed or failed, as shown at step 50. If the test failed, the results are analyzed to determine whether there was a test problem or an actual logic design problem, as shown at step 52. If a test problem is detected, the test is modified and re-executed as shown at step 56. If a logic problem exists, the logic design must be modified, as shown at step 54, and the logic simulations are re-executed to validate the change. When all of the defined test cases pass, as shown at step 58, the logic simulation process is complete.

To verify many of today's systems, and in particular large scale symmetrical multiprocessor systems, parallel execution of a number of independently executing test lists is often desirable. For example, it may be desirable to independently control each port of a multi-port MSU module with a different test list. This may allow each port to operate in a non-deterministic manner relative to the other ports, and may allow the detection of design errors that can only be detected by simulating the often conflicting requests provided by the various ports of the MSU.

When using multiple independently executing test lists, it is sometimes desirable to maintain certain timing relationships therebetween in order to accomplish a desired result. For example, it may be desirable to have a first port write a data value to the MSU, and then have one or more other ports request access to the data value that was written. To accomplish this, the first port must write the data value to the MSU before the other ports request access to the data value. If each of the ports were allowed to operate totally asynchronously relative to one another, this may or may not occur. Thus, it is often desirable to synchronizing the execution of the independently executing test lists at selected synchronization points.

One technique for effectively synchronizing the execution of the independently executing test lists at selected synchronization points is to insert large delays into selected test lists. For example, to have the first port write a data value to the MSU before the other ports request access to the data value, a large delay may be inserted into the test lists of the requesting ports to delay when each port requests access to the data value. A limitation of this approach is that the length of the delay is often difficult to calculate or determine. Thus, if erroneous results are obtained, a designer cannot be certain if the error uncovered a real design error, or if the error occurred because a delay time was under-estimated. For this reason, the designer typically substantially over-estimates the delay times. This tends to cause the execution time of the simulation to increase. Because of the difficulty in defining and executing the desired test cases, as described above, and because of the large number of test cases that are typically required, the logic simulation process can be the longest and most labor intensive part of the design process. Therefore, even a small increase in the efficiency of the logic simulation process, and in particular the test case definition and execution process, may significantly improve the efficiency of the overall design process.

The above limitations are magnified because the test designer must typically define and run a large number of test cases to achieve an adequate fault coverage.

SUMMARY OF THE INVENTION

The present invention overcomes many of the disadvantages of the prior art by providing an improved method and apparatus for synchronizing the execution of two or more test lists at desired synchronization points, while still allowing the test lists to execute in a non-deterministic manner between the synchronization points. In one illustrative embodiment, a test driver is provided to execute each test list, and a run controller is provided to monitor the execution of each test list by monitoring the state of each test driver. To synchronize the execution of two or more test lists, the run controller halts the execution of each test list as each test driver reaches a predetermined state. Once all of the test lists are halted, the test lists are synchronized. Once synchronized, selected test drivers can be restarted to continue relatively non-deterministic execution of the corresponding test lists.

It is contemplated that the test drivers may be Port Drivers, which are controlled by corresponding Port Driver test lists. A Port Driver is a test driver that drives a port of a multi-port circuit design. It is also contemplated that the execution of the Port Drivers may be coordinated by a run control Port Driver, which is controlled by a run control test list. The Port Driver test lists and the run controller test list are preferably generated using a program and spreadsheet interface, as disclosed in U.S. patent application Ser. No. 09/218,384, filed Dec. 22, 1998 entitled "Method And Apparatus For Efficiently Generating Test Input For A Logic Simulator", which is incorporated herein by reference.

In one embodiment, the run control Port Driver initiates the execution of synchronized functions for each of the Port Drivers. The run control Port Driver then waits for an acknowledge signal from each Port Driver, indicating that each of the corresponding functions have been successfully completed. The acknowledge signal may be generated by a special instruction like a halt Jump instruction. Until an acknowledge signal is received from a particular Port Driver, that Port Driver continues execution in a relatively non-deterministic manner, at least relative to the other Port Drivers. The Port Drivers are synchronized when the run control Port Driver receives an acknowledge signal from each of the Port Drivers. Then the run control Port Driver may initiate a next set of functions to accomplish a next operation.

Like the Port Drivers, the run control Port Driver is preferably expressed using a behavioral description language. Accordingly, the run control test list may be initially loaded into a memory or the like incorporated into the behavioral description language of the run control Port Driver. In this configuration, the run control Port Driver may be simulated along with the Port Drivers and the circuit design, thereby reducing the need to interrupt the simulation kernel during simulation. Further, and because the run control Port Driver may monitor the state of each of the Port Drivers during simulation, it is not necessary to add delays to the Port Driver test lists, thereby reducing the required simulation time.

In an illustrative embodiment, the run control Port Driver is used to control a multi-port memory module wherein each port of the multi-port memory module is controlled by a corresponding Port Driver. The run control Port Driver includes a controller for synchronizing the execution of a first set of Port Drivers at desired synchronization points, while allowing the first set of Port Drivers to execute in a non-deterministic manner between the synchronization points.

It is contemplated that each of the acknowledge signals may be triggered by a synchronization command that is executed by each Port Driver. As indicated above, each of the Port Drivers is preferably controlled by a corresponding test list. At least some of the test lists may include one or more commands including a synchronizing command. Accordingly, the run control Port Driver may allow each of a first set of Port Drivers to execute the instructions in their test lists until a synchronization command is detected. The run control Port Driver can detect the synchronization command itself, the state of the corresponding Port Driver as a result of the execution of the synchronization command, or any other parameter that indicates that the synchronization command has been detected. The run control Port Driver may halt each of the Port Drivers as each synchronization command is detected. The Port Drivers arc synchronized when all Port Drivers have been halted. Once synchronized, the run control Port Driver may allow each of a second set of the Port Drivers to begin execution. The first set of Port Drivers and the second set of Port Drivers may or may not include one or more common Port Drivers.

It is contemplated that the run control Port Driver may execute a number of run control Port Driver instructions. A typical run control Port Driver instruction may include a function field and selected other fields including a source mask field and a control mask. The first set of Port Drivers are preferably selected by the source mask, and the second set of Port Drivers are preferably selected by the control mask.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the Figures thereof and wherein:

FIG. 9 is a table showing the various instruction formats for the RCPD instructions;

FIG. 10 is a table showing illustrative RCPD instructions for controlling the RCPD;

DETAILED DESCRIPTION OF THE PREFERRED EMBODIMENTS

Figure 1:
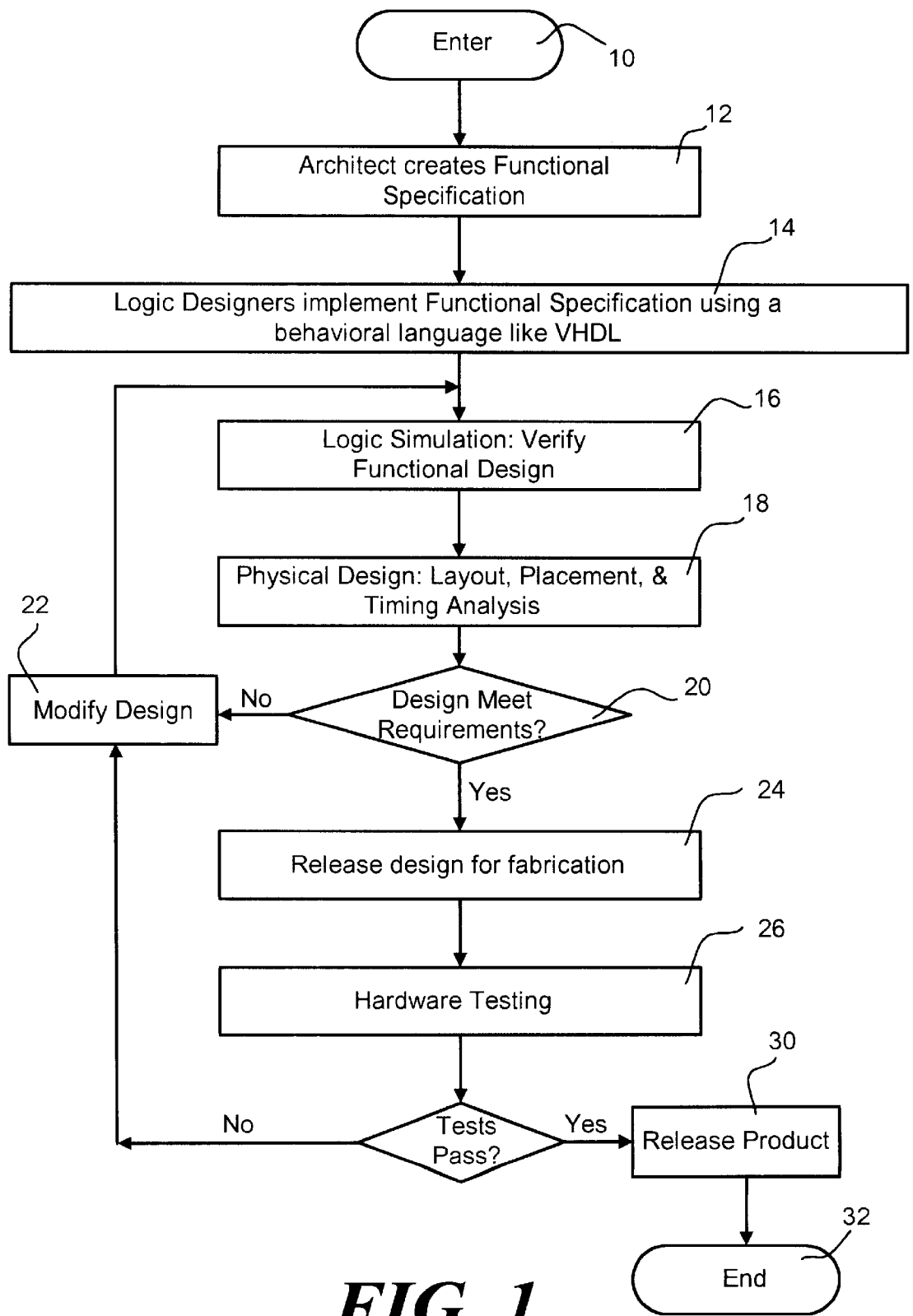
FIG. 1 is a flow diagram showing an illustrative design process in accordance with the prior art.
Figure 2:
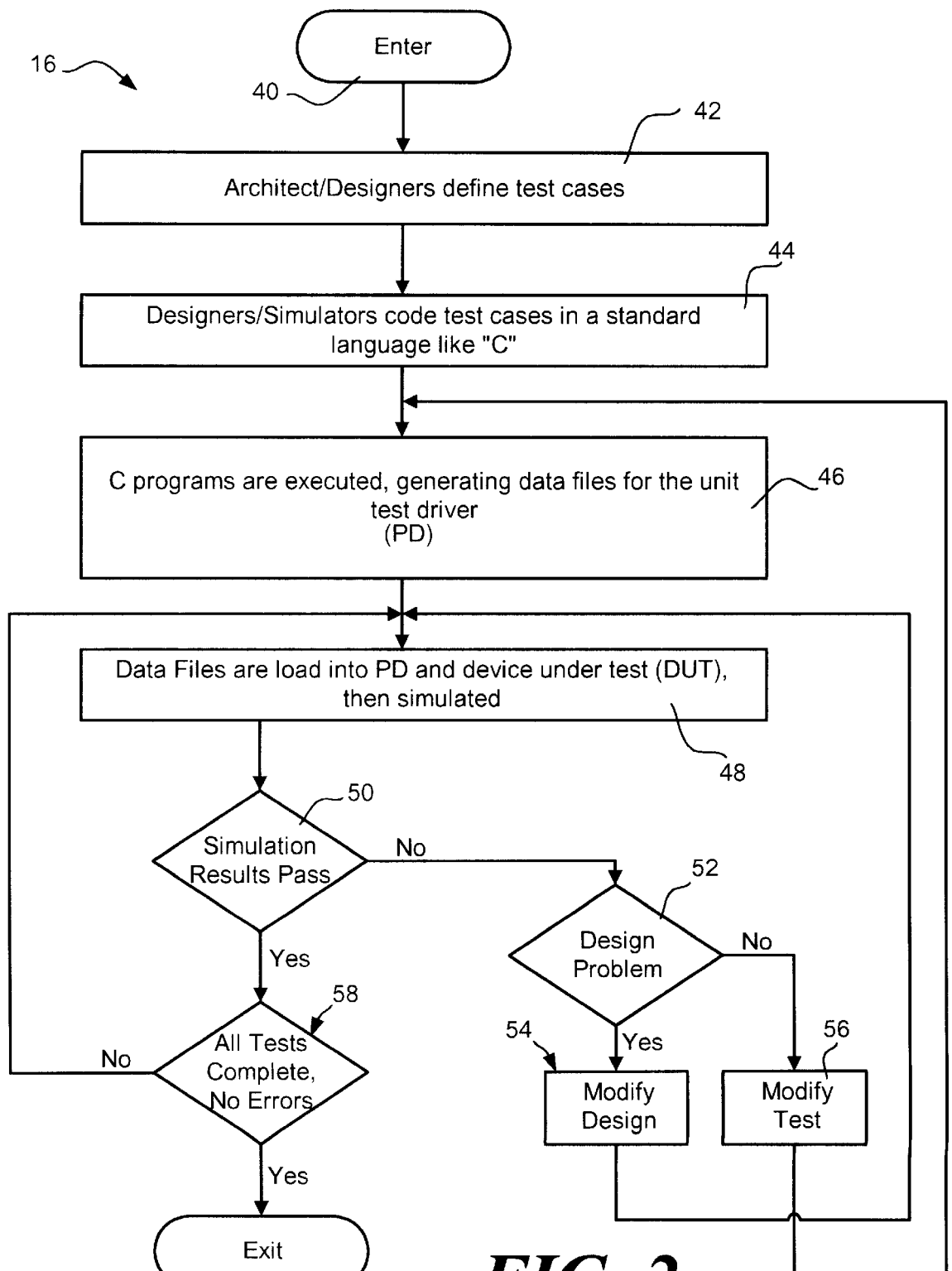
FIG. 2 is a flow diagram showing an illustrative logic simulation process in accordance with the prior art.

The detailed description which follows is presented largely in terms of algorithms and symbolic representations of operations on data bits within a computer memory. These algorithmic descriptions and representations arc the means used by those skilled in the data processing arts to most effectively convey the substance of their work to others skilled in the art.

An algorithm is here, generally, conceived to be a self-consistent sequence of steps leading to a desired result.

These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, or the like. It should be kept in mind, however, that all of these and similar terms are to be associated with the appropriate physical quantities and are merely convenient labels applied to these quantities.

The present invention also relates to an apparatus for performing the operations. This apparatus may be specially constructed for the required purposes or it may comprise a general-purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus to perform the required method steps. The required structure for such machines will be apparent from the description given below.

In sum, the present invention preferably is implemented for practice by a computer, e.g., a source code expression is input to the computer to control operations therein. It is contemplated that a number of source code expressions, in one of many computer languages, could be utilized to implement several aspects of the present invention. A variety of computer systems can be used to practice the present invention including, for example, a personal computer, an engineering work station, a hardware simulator, an enterprise server, etc. The present invention, however, is not limited to practice on any one particular computer system, and the selection of a particular computer system can be made for many reasons.

The present invention provides an improved method and apparatus for synchronizing the execution of the two or more test lists at desired synchronization points, while still allowing the test lists to execute in a non-deterministic manner between the synchronization points. In one illustrative embodiment, a test driver is provided to execute each test list, and a run controller is provided to monitor the execution of each test list by monitoring the state of each test driver. To synchronize the execution of two or more test lists, the run controller halts the execution of each test list as each test driver assumes a predetermined state. Once all of the test lists are halted, the test lists become synchronized. Once synchronized, selected test drivers can be restarted to continue relatively non-deterministic execution of the corresponding test lists.

Figure 3:
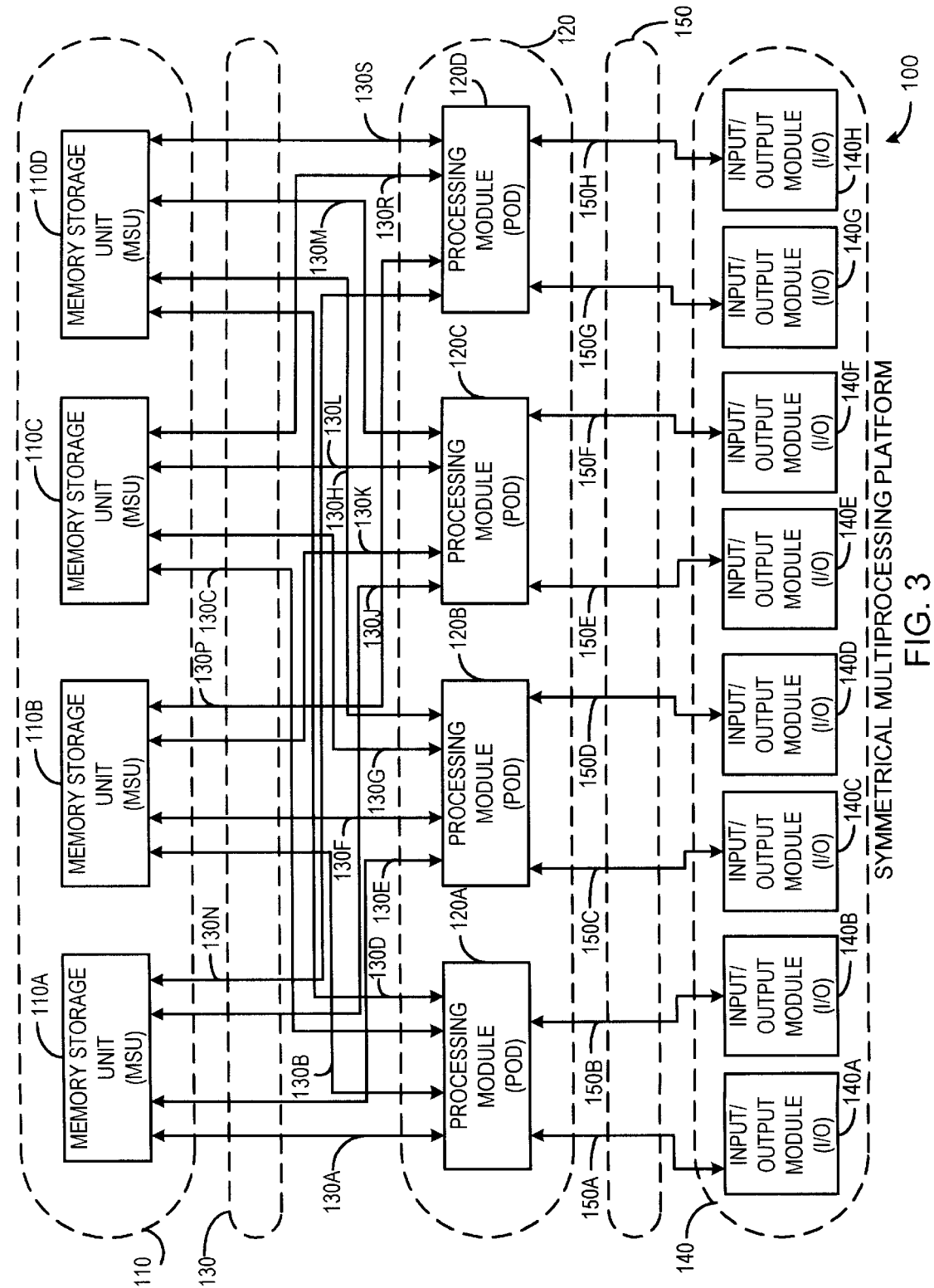
FIG. 3 is block diagram showing an illustrative circuit design including a Symmetrical Multi-Processor (SMP) System Platform.

For illustrative purposes only, the present invention is described in conjunction with a Symmetrical Multi-Processor (SMP) System Platform, as shown in FIG. 3. It is recognized, however, that the present invention may be applied to a wide variety of circuit designs and still achieve many or all of benefits described herein. Referring specifically to FIG. 3, the illustrative System Platform 100 includes one or more Memory Storage Units (MSUs) in dashed Block 110 individually shown as MSU 110A, MSU 110B, MSU 110C, and MSU 110D, and one or more Processing Modules (PODs) in dashed Block 120 individually shown as POD 120A, POD 120B, POD 120C, and POD 120D. Each unit in MSU 110 is interfaced to all PODs 120A, 120B, 120C, and 120D via a dedicated point-to-point connection referred to as an MSU Interface (MI) in dashed Block 130, individually shown as 130A through 130S. For example, MI 130A interfaces POD 120A to MSU 110A, MI 130B interfaces POD 120A to MSU 110B, MI 130C interfaces POD 120A to MSU 110C, MI 130D interfaces POD 120A to MSU 110D, and so on.

POD 120 has direct access to data in any MSU 110 via one of MIs 130. For example, any of PODS 120A–D can communicate with MSU 1110A via Interfaces MI 130A, MI 130E, MI 130J and MI 130N, respectively. Preferably, each MI interface comprises separate bi-directional data and bi-directional address/command interconnections, and further includes unidirectional control lines that control the operation of the data and address/command interconnections. One of the unidirectional control lines is a POD to MSU address request signal (REQ). This signal starts a POD to MSU request transaction. The bidirectional address/command interconnection provides fields that specify the desired function (FNCT) for the request. For POD to MSU requests, there is preferably a CMD field, an address field, a job number field, and several other fields.

System Platform 100 further comprises Input/Output (I/O) Modules in dashed Block 140 individually shown as I/O Modules 140A through 140H, which provide the interface between various Input/Output devices and one of the PODs 120. Each I/O Module 140 is connected to one of the PODS across a dedicated point-to-point connection called the MIO Interface in dashed Block 150 individually shown as 150A through 150H. For example, I/O Module 140A is connected to POD 120A via a dedicated point-to-point MIO Interface 150A. The MIO Interfaces 150 are similar to the MI Interfaces 130, but may have a transfer rate that is approximately half the transfer rate of the MI Interfaces because the I/O Modules 140 are located at a greater distance from the PODs 120 than are the MSUs 110.

Figure 4:
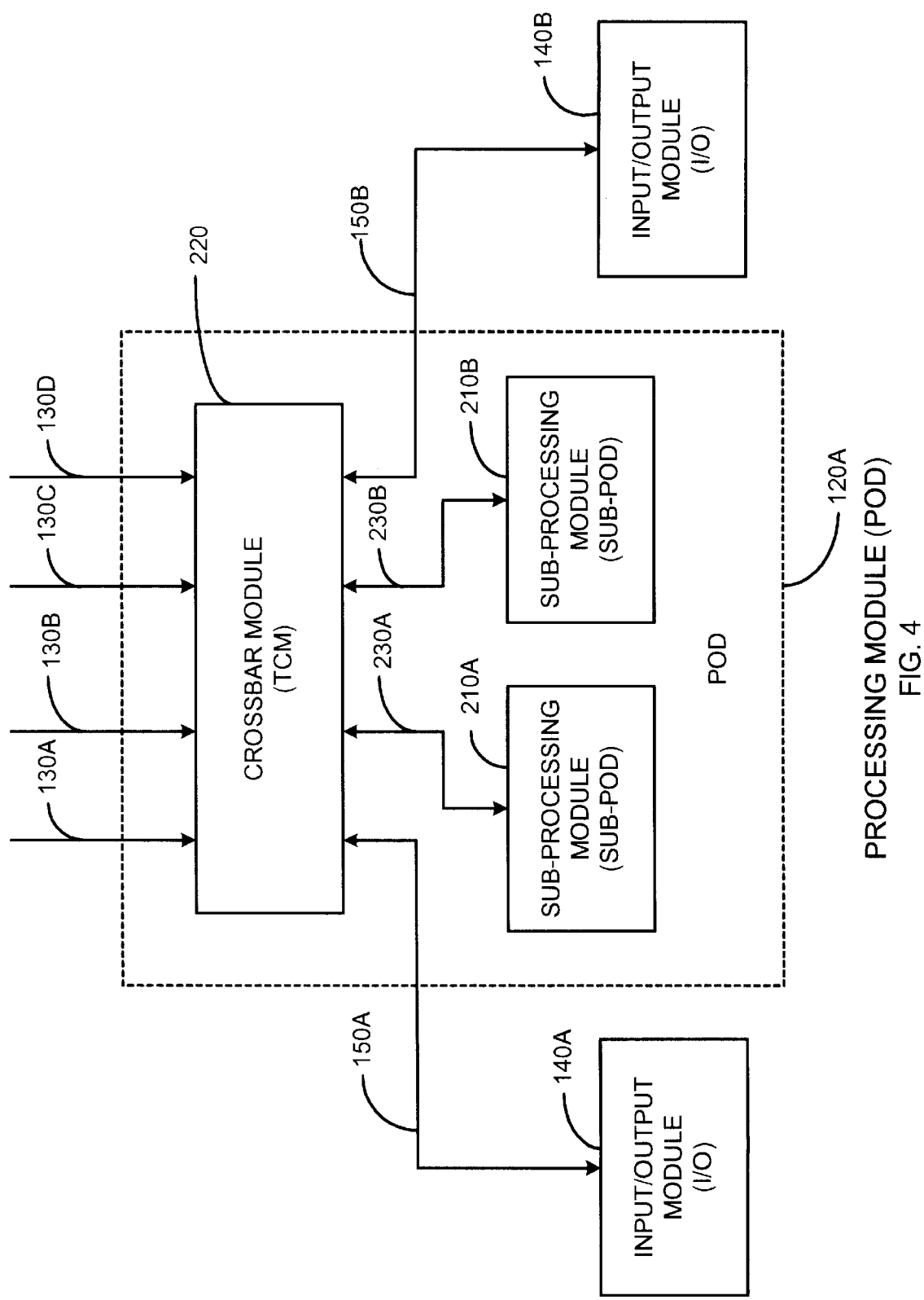
FIG. 4 is a block diagram of one of the processing modules (PODs) of FIG. 3.

FIG. 4 is a block diagram of one of the processing modules (PODs) of FIG. 3. POD 120A is shown, but each of the PODS 120A through 120D may have a similar configuration. POD 120A includes two Sub-Processing Modules (Sub-PODs) 210A and 210B. Each of the Sub-PODs 210A and 210B are interconnected to a Crossbar Module (TCM) 220 through dedicated point-to-point Interfaces 230A and 230B, respectively, that are similar to the MI Interconnections 130. TCM 220 further interconnects to one or more I/O Modules 140 via the respective point-to-point MIO Interfaces 150. TCM 220 both buffers data and functions as a switch between Interfaces 230A, 230B, 150A, 150B, and MI Interfaces 130A through 130D. When an I/O Module 140 or a Sub-POD 210 is interconnected to one of the MSUs via the TCM 220, the MSU connection is determined by the address provided by the I/O Module or the Sub-POD, respectively. In general, the TCM maps one-fourth (¼) of the memory address space to each of the MSUs 110A–110D. According to one embodiment of the current system platform, the TCM 220 can further be configured to perform address interleaving functions to the various MSUs. The TCM may also be utilized to perform address translation functions that are necessary for ensuring that each processor (see FIG. 5) within each of the Sub-PODs 210 and each I/O Module 140 views memory as existing within a contiguous address space as is required by certain off-the-shelf operating systems.

The I/O Modules 140 may be external to Sub-POD 210 as shown in FIG. 4. This allows System Platform 100 to be configured based on the number of I/O devices used in a particular application. In another embodiment configuration, one or more I/O Modules 140 are incorporated into Sub-PODs 120.

Figure 5:
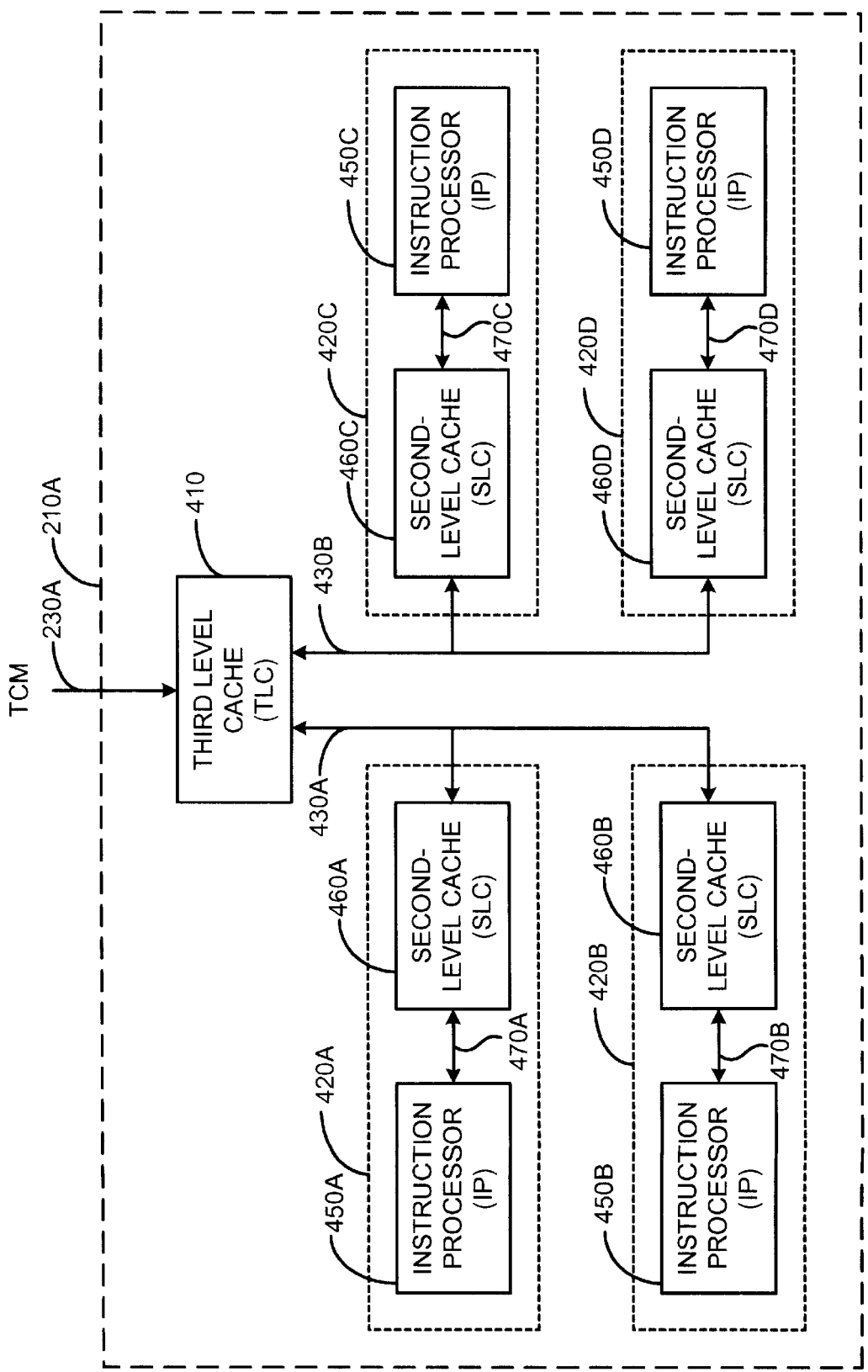
FIG. 5 is a block diagram of one of the Sub-Processing Modules (Sub-PODs) of FIG. 4.

FIG. 5 is a block diagram of one of the Sub-Processing Modules (Sub-PODs) shown in FIG. 4. Sub-POD 210A is shown, but it is understood that all Sub-PODs 210 may have a similar configuration. Sub-POD 210A may include a Third-Level Cache (TLC) 410 and one or more Coherency Domains 420 (shown as Coherency Domains 420A, 420B, 420C, and 420D). TLC 410 is connected to Coherency Domains 420A and 420B via Bus 430A, and is connected to Coherency Domains 420C and 420D via Bus 430B. TLC 410 caches data from the MSU, and maintains data coherency among all of Coherency Domains 420, helping to ensure that each processor is always operating on the latest copy of the data.

Each Coherency Domain 420 includes an Instruction Processor (IP) 450 (shown as IPs 450A, 450B, 450C, and 450D), and a Second-Level Cache (SLC) 460 (shown as SLC 460A, 460B, 460C, and 460D.) Each SLC interfaces to an IP via a respective point-to-point Interface 470 (shown as Interfaces 470A, 470B, 470C, and 470D), and each SLC further interfaces to the TLC via Bus 430 (shown as 430A and 430B). For example, SLC 460A interfaces to IP 450A via Interface 470A and to TLC 410 via Bus 430A. Similarly, SLC 460C interfaces to IP 450C via Interface 470C and to TLC 410 via Bus 430B. Each SLC caches data from the TLC as requested by the interconnecting IP 450.

Each of the Interfaces 470 may be similar to the MI Interfaces 130, but may have a transfer rate that is approximately twenty-five percent (25%) higher than the transfer rate of each of the MI Interfaces. This difference in transfer rates creates an asynchronous boundary between Interfaces 470 and the MI Interfaces 130. This asynchronous boundary is managed by staging registers in the TCM 220.

IP 450 and SLC 460 may be integrated in a single device, such as in a Pentium Processing device available from the Intel Corporation. Alternatively, the IP 450 may be an A-Series Instruction Processor or a 2200-Series Instruction Processor, both commercially available from the Unisys Corporation. In this latter configuration, the IP 450 is externally coupled to an SLC 460.

A further discussion of the Symmetrical Multi-Processor (SMP) System Platform 100, shown and described with reference to FIGS. 3–5, can be found in co-pending U.S. patent application Ser. No. 08/965,004, filed Nov. 5, 1997, entitled "A Directory-Based Cache Coherency System"; U.S. patent application Ser. No. 08/964,606, filed Nov. 5, 1997, entitled "Message Flow Protocol for Avoiding Deadlocks"; U.S. patent application Ser. No. 09/001,588, filed Dec. 31, 1997, entitled "High-speed Memory Storage Unit for a Multiprocessor System Having Integrated Directory and Data Storage Subsystems"; and U.S. patent application Ser. No. 09/001,592, filed Dec. 31, 1997, entitled "High-Performance Modular Memory System with Crossbar Connections", all assigned to the assignee of the present invention and all incorporated herein by reference.

Figure 6:
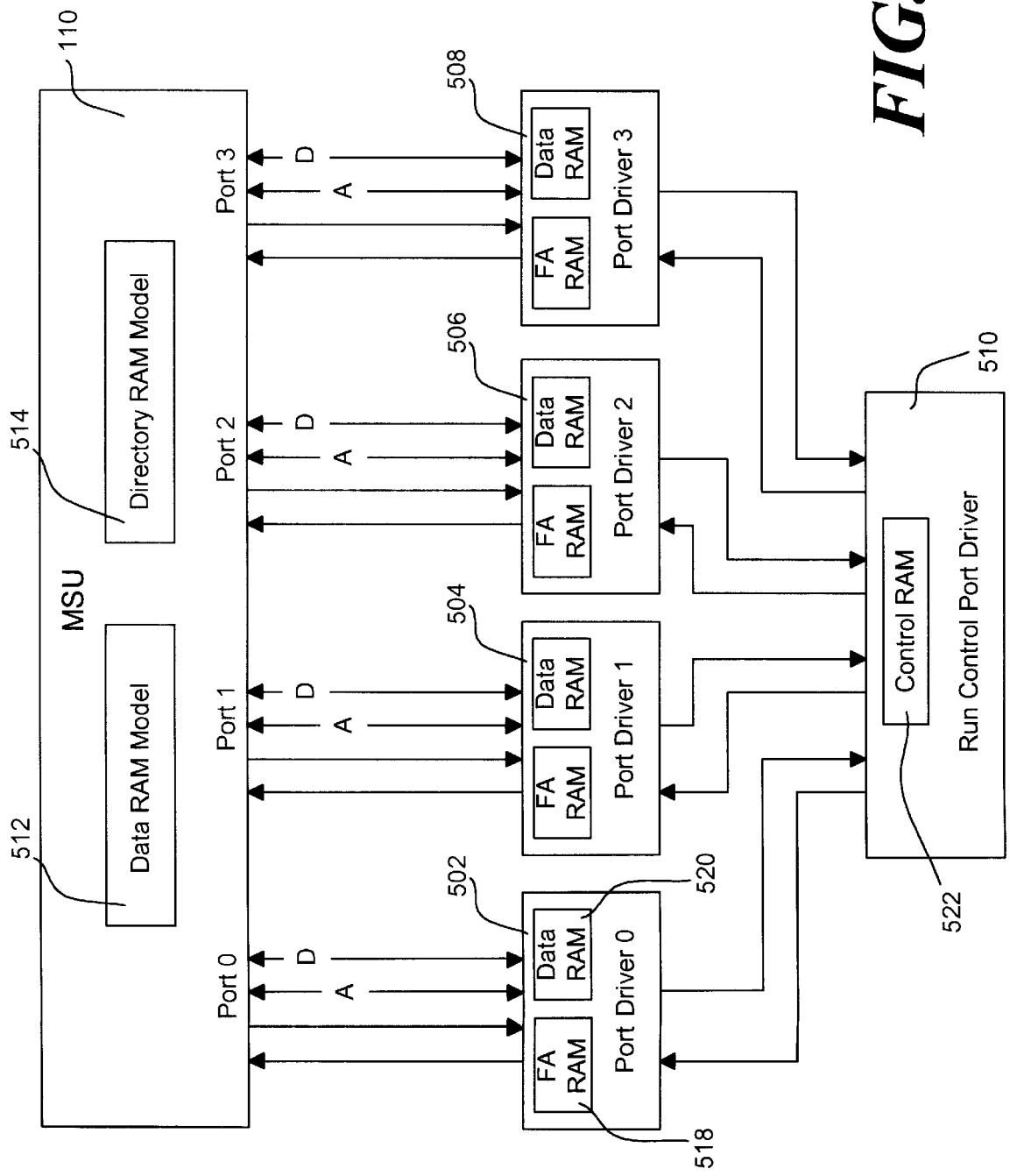
FIG. 6 is an illustrative schematic for functionally simulating the MSU 110 of FIG. 3.

FIG. 6 is an illustrative schematic for functionally simulating the MSU 110 of FIG. 3. There are three main types of entities in this diagram. The first includes the four Port MSU 110, which represents the device-under-test or circuit design and is further described above with respect to FIG. 3. The second is the four Port Drivers 502, 504, 506, and 508, which drive and receive the input and output signals of the MSU 110. The third is the Run Control Port Driver 510. The Run Control Port Driver selectively controls the synchronization of the test cases that are executed by each of the four Port Drivers 502, 504, 506, and 508. The four Port Drivers 502, 504, 506, and 508 and the Run Control Driver 510 are test drivers to aid in the simulation of the MSU 110.

In the illustrative embodiment, the MSU 110 has two types of RAM (Random Access Memory) models. One is the Data RAM Model 512 and the other is the Directory RAM Model 514. The Data RAM model 512 contains the cache line information that is transferred to and from the MSU via the Data lines connected to the four ports. The Directory RAM model 514 contains the state information for each cache line in the Data RAM Model 512. Both of the RAM Models are initially loaded with information from data files that are generated using a spreadsheet template and a computer program, as more fully described below.

The four Port Drivers 502, 504, 506, and 508 preferably provide test vectors such as Commands, Addresses, and Data to the MSU 110. In an illustrative embodiment, each of the Port Drivers 502, 504, 506, and 508 may stimulate the MSU 110, and verify the response provided by the circuit design. The Port Drivers preferably verify both the data returned by the MSU 110 as a result of executing a command and the control signals provided by the MSU 110 that control the transfer mechanisms. Each of the Port Drivers 502, 504, 506, and 508 also preferably respond to selected requests provided by MSU 110, such as return, purge, or other requests. By receiving and responding to selected requests, each Port Driver 502, 504, 506, and 508 may allow more varieties of circuit designs to be simulated at a lower level of logic simulation.

Preferably, the Port Drivers 502, 504, 506, and 508 each contain two RAM Models, including an FA RAM model and a Data RAM model. The FA RAM model, for example FA RAM model 518, is preferably loaded with lists of instructions that represent a test case for a particular MSU port. The data files that contain the compiled lists of instructions are preferably generated by C programs, which are derived from parameters provided in a spreadsheet template.

The Run Control Port Driver (RCPD) 510 preferably coordinates the execution of the instructions in the four Port Drivers 502, 504, 506, and 508. For example, the RCPD 510 may start one Port Driver, while leaving the other three in a halted state, or start all four Port Drivers simultaneously. The particular test case will, of course, dictate the order and sequence of the execution of the Port Drivers. The RCPD 510 operates under program control based on the instructions loaded in Control RAM 522 prior to simulation. The compiled instructions are located in files that are generated by the above-referenced C programs. Preferably, the RCPD instructions are automatically generated by using the position of the Port Driver commands within the spreadsheet template.

Figure 7:
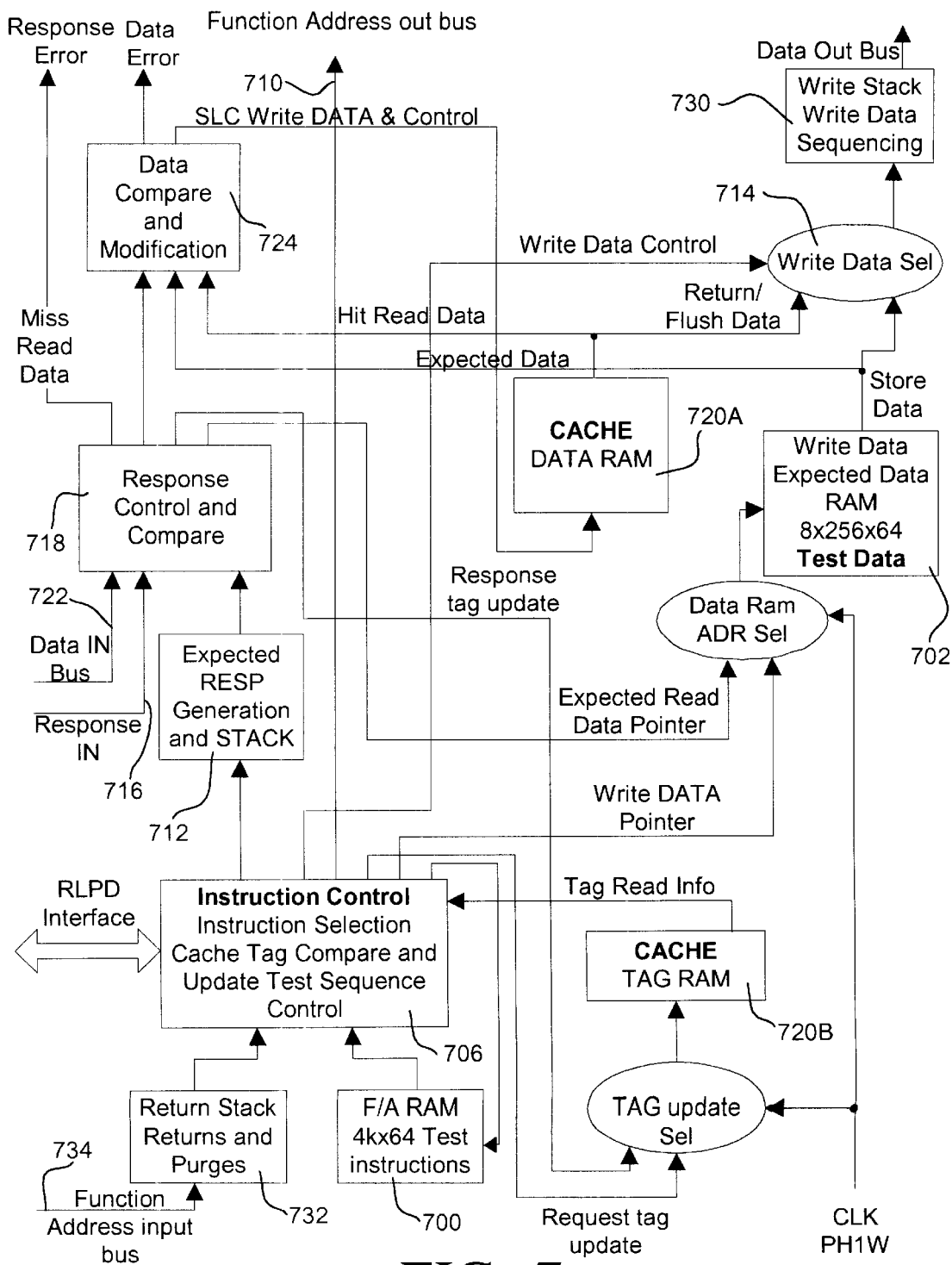
FIG. 7 is a block diagram of one of the Port Drivers of FIG. 6.

FIG. 7 is a block diagram of one of the Port Drivers shown in FIG. 6. The Port Driver is designed to test all of the coherency and ordering functions of the MSU 110, as well as the normal fetch and store operations of a memory. As shown in FIG. 6, a Port Driver is connected to each of the four ports of the MSU 110. Accordingly, each Port Driver must emulate a POD, and therefore, must be able to send requests that appear to come from two I/O modules and two Sub-PODs (see FIGS. 3–4).

The MSU 110 keeps track of the Ownership and/or Copy state for each cache line. When a Port Driver makes a request for a cache line that is currently owned by another Port Driver, the MSU requires the owning Port Driver to return the cache line or purge any copies therefrom. The Port Driver must keep track of which sub-unit it sent the request from, and be able to respond to coherency functions sent from the MSU. To do this, the Port Driver has a Cache that holds the data and tag information, and also tracks which of the 4 sub-units has ownership or copies of each cache line.

The Port Driver executes a sequence of instructions (test) which are loaded into the Function Address (F/A) RAM 700 and uses data that is loaded into the Test Data RAM 702. The instructions may contain a function, an address, a data pointer, and/or some information for verifying responses and data masking. The data pointer is an address for the Test Data RAM 702, pointing to Data that will be used for either write data for Stores or as compare data for Fetches. Illustrative fields of an FA RAM instruction are shown in FIG. 9.

As the tests are executed, the Port Drive r selects instructions from either the FA RAM 700, or from the Return stack 732 if the MSU has sent coherency functions. The Instruction Control section 706 chooses the functions and sends the requests out on the FA bus 710. It also sends information to the Expected Response Generation Block 712, and sends data control signals to the write data select Block 714 if the function is a Store or Send Message. The Port Driver can have up to 15 outstanding fetch requests at one time. The requests are tracked with a Job Number, which is sent back with any MSU response. When the MSU sends a response via Response Interface 716, the Response Control Block 718 uses the Job Number to look up the information needed to write the data into the Cache 720 A,B, and keep track of the sub-units that now have a Copy or Ownership of the Cache line.

The MSU ensures that all requests get the latest data for a given cache line. To accomplish this, the MSU performs coherency operations including return requests to notify previous owners that they need to return ownership or purge their copies. The Port Driver uses two special features to verify that the MSU is performing these coherency operations correctly.

As indicated above, the Fetch and Modify operation can be used to verify that the most recent data is returned from one Port Driver and provided to the requesting Port Driver, rather than receiving old data that is resident in the MSU. The Cache 720A,B also has the ability to get a Cache "HIT" in response to a Fetch request, which causes expected data to be compared to the data in the Cache 720A, with the request never being sent to the MSU.

This Cache Hit feature, along with the Data Modification feature, can be used to verify that purges get sent to sub-units that have copies of selected cache lines. For example, when a requester asks for ownership of a cache line, the requester may modify the data, which then requires that all other copies be purged. If a sub-unit that has a copy issues another Fetch Copy, the Port Driver Cache 720B will check to see if it still has a copy, and if so, would get a "HIT". However, in this case, the cache would have the old data. If a purge is done, a "MISS" will occur, and the Fetch Copy will be sent to the MSU to get the New data.

The Port Drivers are also able to return or flush Modified or Original data on their own initiative. Because there is only one Cache 720A,B that represents four requesters, a particular cache line may have to be flushed to make room for one of the other requesters to use the cache location. Therefore, if another requester or the same requester wants to use a cache location for a different cache line (different Set address) the cache line that is currently using, the location may be flushed back to the MSU before the new requester sends the new Fetch. If another requester wants the same cache line, the fetch will be sent and the Port Driver will let the MSU send the coherency function (return or purge). Then the old owner will perform the return of the cache line thus freeing the cache location for the response to the new fetch. Port drivers may also purge data if it has been determined that the data has aged out.

The types of returns received by the Port Drivers are determined by the coherency function sent by the MSU and by whether or not the data has been modified by the Port Driver. The MSU can request returns without data if the data has not been changed (to reduce data bus traffic), returns with data if the data has been changed, or return ownership while maintaining a copy in the local Cache 720.

The Response Control and Compare Block 718 receives a "Data IN" signal via Interface 722. The MSU provides any data including cache line data to the Port Driver via the "Data IN" signal. The "Data IN" signal is synchronized with the "Response IN" signal discussed above. The Response Control and Compare Block 718 validates the response code, and presents the MSU data to the Data Compare and Modification Block 724. The Data Compare and Modification Block 724 compares the MSU data against the expected data, and then increments the appropriate container of the cache line. The incremented value is routed to the Cache Data RAM 720A, where it is stored in the Cache. The next reference by the Port Driver to this location will then be compared against the increment value, rather than the original value. Also, every reference to the cache line thereafter will read the cache line from the cache (assuming the cache is still valid), compare the cache line with an expected value, modified by incrementing the appropriate container, and rewrite the modified cache line to the Cache 720A,B.

The Port Driver Test Data RAM 702 can store 256 unique cache lines. Each FA instruction has a DTPTR field (bits 42:35) that select a location in the Test Data RAM 702. The data from that location will then become either the write data for Store functions or the expected read data for Fetch functions.

Several GRA type stacks are used inside the Port Driver to save control information and data that is needed at a later time. For example, the write stack 730 buffers up to 16 cache lines of Write data until they can be sent to the MSU. The Expected Read Data Stack (included in Block 702) holds the expected read data. When a Fetch command is sent out, the expected read data is saved in this stack in a location addressed by the Job Number of the fetch request. When the response comes back, the Job Number field in the response is used to read this stack. The read data from MSU is then compared to the stack output to determine if the correct data was read from the MSU.

Return and purge requests provided by the MSU on the function address input bus 734 may be stacked in the Return stack 732 until they can be serviced. Although the Return/ Purge functions have priority over all other request types (new FA instructions, saved Stores, saved Fetches, etc.), they still can get stacked up if one of them runs into a address conflict. The cache line is in a conflict state when the fetch request has been sent to the MSU, but a response has not yet been received.

The Expected Response Block 712 preferably includes an Expected Response Stack. The Expected Response Stack may be addressed by a Job Number. When a request is sent out the expected response information is loaded into this stack. Stored along with the expected response is a response mask value. The expected response and mask value are generated by a combination of hardware and test writer input. Part of the expected response can be predicted by hardware when the request is provided. However, the bits that cannot be predicted are masked out unless they are supplied by the test writer. When a response is received via the Response IN Interface 716, the Job Number in the response is used to read the Expected Response Stack, and the expected data along with the response mask are used to verify the response.

The Response Control and Compare Block 718 preferably includes a Response Address Save stack. The Response Address Save Stack is used to tie a Job Number back to an MSU address so the Port Driver Cache Tag 720B and Cache Data 720A can be updated when a response is received from the MSU. When a response is received, the only thing to identify the response is the Job Number. The Job Number is used to read this stack, which contains several pieces of information necessary to maintaining the Cache 720 and perform the data compare. The Response Address Save Stack also contains the MSU address used for addressing the Cache Tag 720B and Cache Data 720A.

Figure 8:
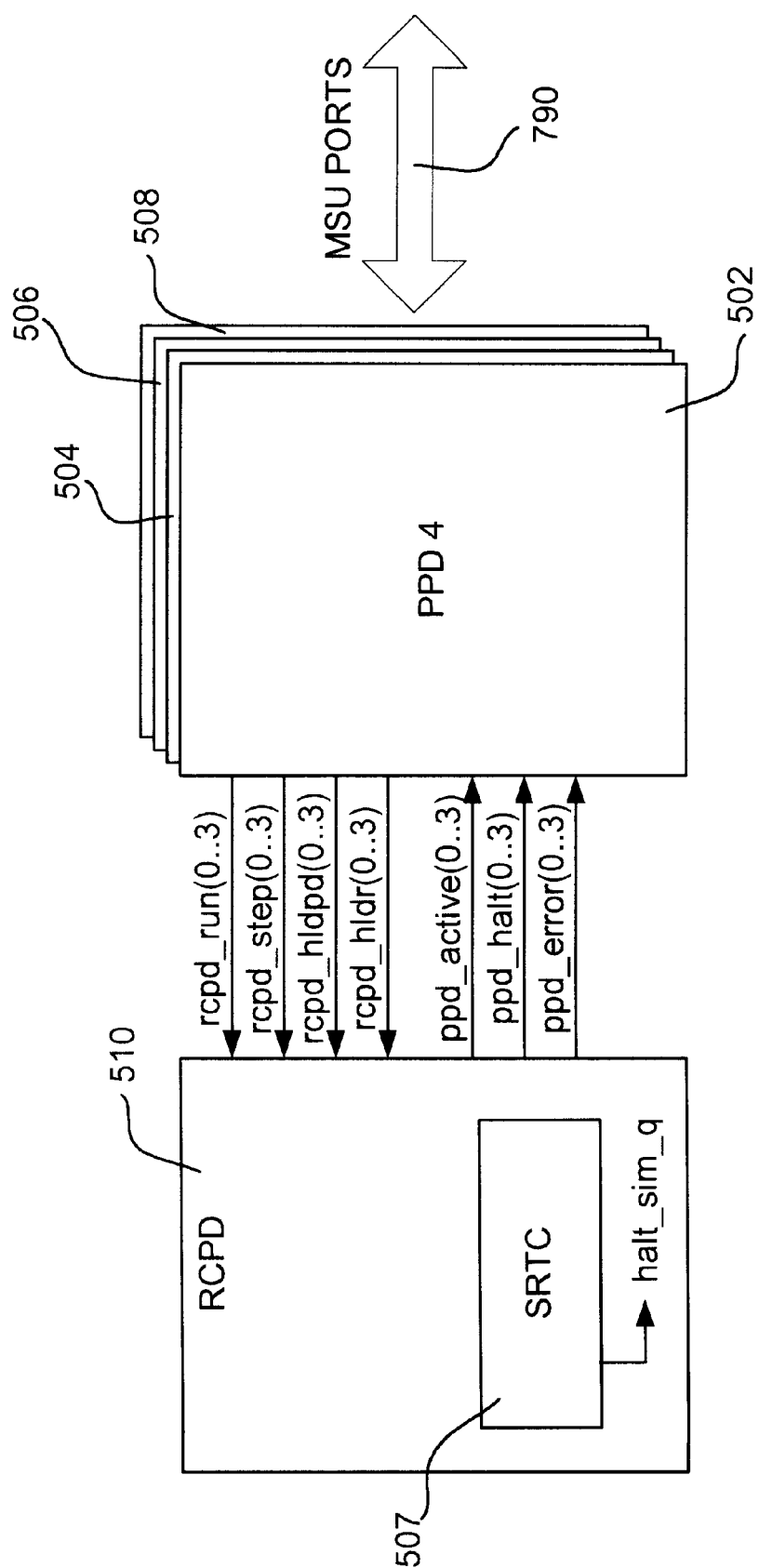
FIG. 8 is a block diagram detailing the RCPD/Port Driver Interface.

FIG. 8 is a block diagram further detailing the RCPD/Port Driver Interface. As indicated above, the RCPD 510 provides control signals needed to start, stop, and selectively synchronize the four Port Drivers 502, 504, 506, and 508. The RCPD 510 accomplishes this by, for example, reading and executing RCPD instructions stored in the Instruction Control RAM 522 (see FIG. 6). The RCPD 510 typically executes the instruction beginning at address 0 of the Instruction Control RAM 522 and continues until a Halt instruction or an error condition occurs. All RCPD instructions are preferably 12 bits wide (11 Down to 0), with some instructions having a control mask field for allowing only selected Port Drivers to participate in the instruction. A discussion of typical RCPD instructions is provided below with respect to FIGS. 9–10.

The RCPD 510 provides a number of signals to the Port Drivers 502, 504, 506, and 508 including rcpd_run signals(0 . . . 3), rcpd_step signals(0 . . . 3), rcpd_hldpd signals(0 . . . 3), and rcpd_hldr signals(0 . . . 3). Likewise, the Port Drivers provide a number of signals back to the RCPD 510 including ppd_active signals(0 . . . 3), ppd_halt signals(0 . . . 3), and ppd _error signals(0 . . . 3). The notation (0 . . . 3) indicates that there are actually four of each of these signals, one for each Port Driver in the system.

Figure 14:
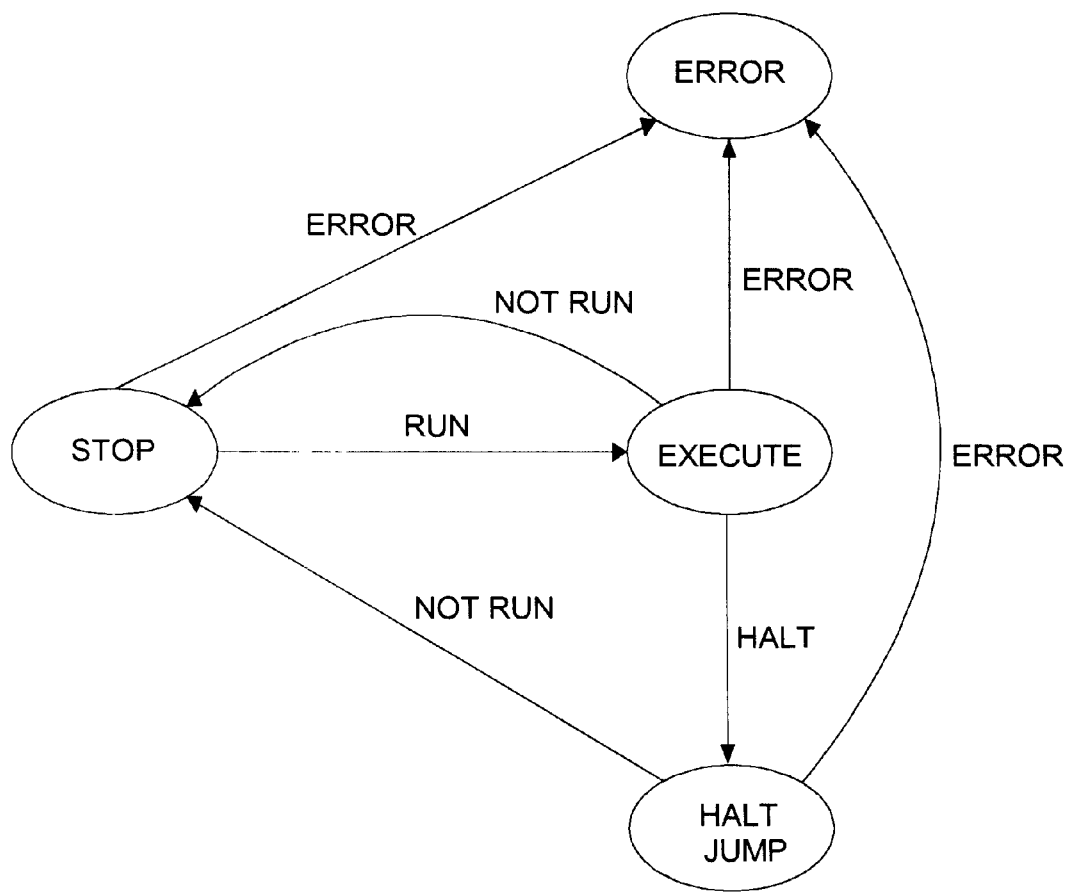
FIG. 14 is a state diagram for the Port Driver.

The rcpd_run signals(0 . . . 3) are asserted by the RCPD 510 when a start instruction is executed. However, only those rcpd_run signals (0 . . . 3) that correspond to those Port Drivers selected by the control mask of the start instruction and are currently in the Stop state are asserted by the RCPD 510. The execution of a Resume or Step instruction by the RCPD 510 causes a one-cycle de-assertion of the rcpd_run signal for all Port Drivers that are selected by the corresponding control mask, bringing them to the Stop state from the Halt Jump state for one cycle, and then to the Execute state after the signal is again asserted. When a Port Driver enters the Stop state the ppd_halt signal is asserted. The ppd halt signal is provided to the SRTC (Simulation Run Time Controller) Block 507, which controls when the simulation is stopped. FIG. 14 shows an illustrative state transition diagram of a Port Driver, including the Stop, Halt Jump, Execute and Error states.

The rcpd_step signals(0 . . . 3) that correspond to the Port Drivers selected by the control mask are asserted when the RCPD 510 executes a step instruction. Likewise, the rcpd_ hldpd signals(0 . . . 3) that correspond to the Port Drivers selected by the control mask are asserted when the RCPD 510 executes a Set Hold PR instruction (see FIG. 10), and are de-asserted when the RCPD 510 executes a Clear Hold PR instruction. The rcpd_hldr signals(0 . . . 3) that correspond to the Port Drivers that are selected by the control mask are asserted when the RCPD 510 executes a Set Hold R instruction (see FIG. 10), and are de-asserted when a Clear Hold R instruction is executed.

The ppd_active signals(0 . . . 3) are asserted by those Port Driver that are in the Execute state. The ppd_halt signals(0 . . . 3) are asserted by those Port Drivers that have executed a Halt instruction, a Halt Jump instruction, or are at the completion of a RCPD Step instruction. Finally, the ppd_error signals(0 . . . 3) are asserted when a Port Driver detects an error. The ppd_error signals(0 . . . 3) remain asserted while the corresponding Port Driver is in the Error state.

As shown in FIG. 8, the four Port Drivers 502, 504, 506, and 508 are connected to an MSU 110 via Interface 790. Interface 790 is used to transmit data address and/or control information between each of the Port Drivers 502, 504, 506, and 508 and the MSU 110.

As indicated above, the RCPD 510 is preferably controlled by an RCPD test list that includes a number of RCPD instructions. The RCPD instructions can take on one of four instruction formats. FIG. 9 is a table showing four RCPD instruction formats. Format-1 800 includes a four-bit function field and a four-bit control mask field. The four-bit function field identifies one of a number of desired functions. Illustrative functions can be found in column 814 of FIG. 10. The control mask field indicates which Port Drivers should participate in the instruction.

Format-2 802 includes a four-bit function field, a four-bit control mask field, and a four-bit source mask field. The source mask is similar to the control mask, but indicates which Port Drivers to observe during the execution of the instruction. Both the source mask and the control mask are decoded fields where each bit corresponds to a Port Driver.

Format-3 804 includes a four-bit function field and an eight-bit cycle count field. The Cycle Count field is used by the Short Wait and Long Wait instructions (see FIG. 10) to specify a number of wait clock cycles. Finally, Format-4 806 only includes a four-bit function field.

FIG. 10 is a table showing illustrative RCPD instructions that may be used for controlling the RCPD 510. The first column 810 of the table 808 recites the function name for each of sixteen (16) functions, four (4) of which are designated as "Reserved". The second column 812 of table 808 recites the compiler code for each of the functions. The third column 814 of table 808 recites the binary code for each of the functions. The binary code is provided in the four-bit function field of the RCPD instruction formats shown in FIG. 9. The fourth column 816 of table 808 recites the control type for each of the functions. Nine of the functions are designated as Port Driver (PPD) control type functions, and three are designated as RCPD control type functions. The Port Driver control type functions control the synchronization and interface holds for the Port Drivers, and the RCPD control type functions control the RCPD instruction stream. Finally, the fifth column 818 of table 808 recites the format type for each of the functions. The format type corresponds to one of the instruction formats discussed above with respect to FIG. 9 above.

Each of the instructions listed in column 810 of table 808 will now be discussed. The Halt RCPD instruction stops the RCPD instruction stream, leaving the RCPD in the Stop state. As indicated in the fifth column 818, the Halt RCPD instruction is a Format-4 instruction 806.

The Wait instructions cause the RCPD to wait a specified number of clock cycles before processing the next RCPD instruction. The Short Wait instruction waits for the number of clock cycles specified in the Cycle Count field before allowing the next RCPD instruction to be executed. The Long Wait instruction waits for the number of clock cycles specified in the Cycle Count field plus 256 clock cycles before allowing the next RCPD instruction to be executed. The Short Wait and Long Wait instructions are Format-3 instructions 804.

The Step instruction causes each of the Port Drivers selected by the control mask to execute one instruction, but only after each of the Port Drivers selected by the source mask reach the Halt Jump state. After executing the instruction, each of the Port Drivers selected by the control mask stop in the Halt Jump state. The Port Drivers selected by the source mask do not resume normal instruction execution until the RCPD executes a corresponding Resume instruction (see below) with the corresponding Port Driver selected in the corresponding control mask. The Step instruction is a Format-2 instruction 802.

The Resume Instruction waits for the Port Drivers selected in the source mask to reach the Halt Jump state. After reaching the Halt Jump state, a resume is issued to the Port Drivers selected in the control mask to resume normal execution (i.e., bringing the Port Drivers to the Execute state). The Resume Instruction is a Format-2 instruction 802.

The RCPD identifies which of the Port Drivers reach the Halt Jump state by monitoring the corresponding ppd_halt and ppd_active signals. Once in the Halt Jump state, the Resume instruction de-asserts the corresponding rcpd_run signal for one cycle, causing the corresponding ppd_halt and ppd_active signals to change states for one cycle. By asserting the rcpd_run signal again, the corresponding Port Driver is brought to the Execute state, and the Port Driver asserts the corresponding ppd_active signal.

The Set Hold Purge/Return Instruction instructs the Port Drivers selected by the control mask to notify the MSU (by setting a corresponding P_HOLD signal) that further purge/return functions should not be issued to the corresponding Port Driver. The Set Hold Purge/Return Instruction is a Format-1 instruction 800.

The Clear Hold Purge/Return Instruction instructs the Port Drivers selected by the control mask to notify the MSU (by clearing the corresponding P_HOLD signal) that further purge/return functions can now be provided to the corresponding Port Driver. The Clear Hold Purge/Return Instruction is also a Format-1 instruction 800.

The Set Hold Response Instruction instructs the Port Drivers selected by the control mask to notify the MSU (by setting the corresponding P_HOLD signal) that further responses should not be issued to the corresponding Port Driver. The Set Hold Response Instruction is a Format-1 instruction 800.

The Clear Hold Response Instruction instructs the Port Drivers selected by the control mask to notify the MSU (by clearing the P_HOLD signal) that further responses may now be provided the corresponding Port Driver. The Clear Hold Response Instruction is a Format-1 instruction.

The Start Instruction instructs the Port Drivers selected by the control mask to start or restart execution of the respective test lists. All RCPD test lists must begin with a Start instruction. However, a given test list may have more than one Start instruction. Further, the Port Drivers identified by the control mask of the Start instruction must be in the Stop state. The Start instruction causes the rcpd_run signal to be asserted, causing the corresponding Port Drivers to assert the ppd_active signal, as discussed above.

The Stop Instruction instructs the Port Drivers selected by the control mask (which are in the Execute state) to: (1) stop executing new instructions; (2) wait for all pending MSU requests to be satisfied; and (3) bring the corresponding Port Drivers to the Stop state. The Stop instruction causes the rcpd_run signal to be de-asserted, causing the corresponding Port Drivers to de-assert the corresponding ppd_active signals after all outstanding requests are satisfied by the MSU. Port Drivers that have been stopped can only be started again with a Start instruction.

The Halt Port Driver Instruction instructs the Port Drivers identified by the control mask to enter the Stop state after all outstanding requests have been satisfied. One reason for this instruction is to allow a given Port Driver to start an endless loop and have the RCPD stop it when all other Port Drivers have completed execution of their test lists.

Figure 11:
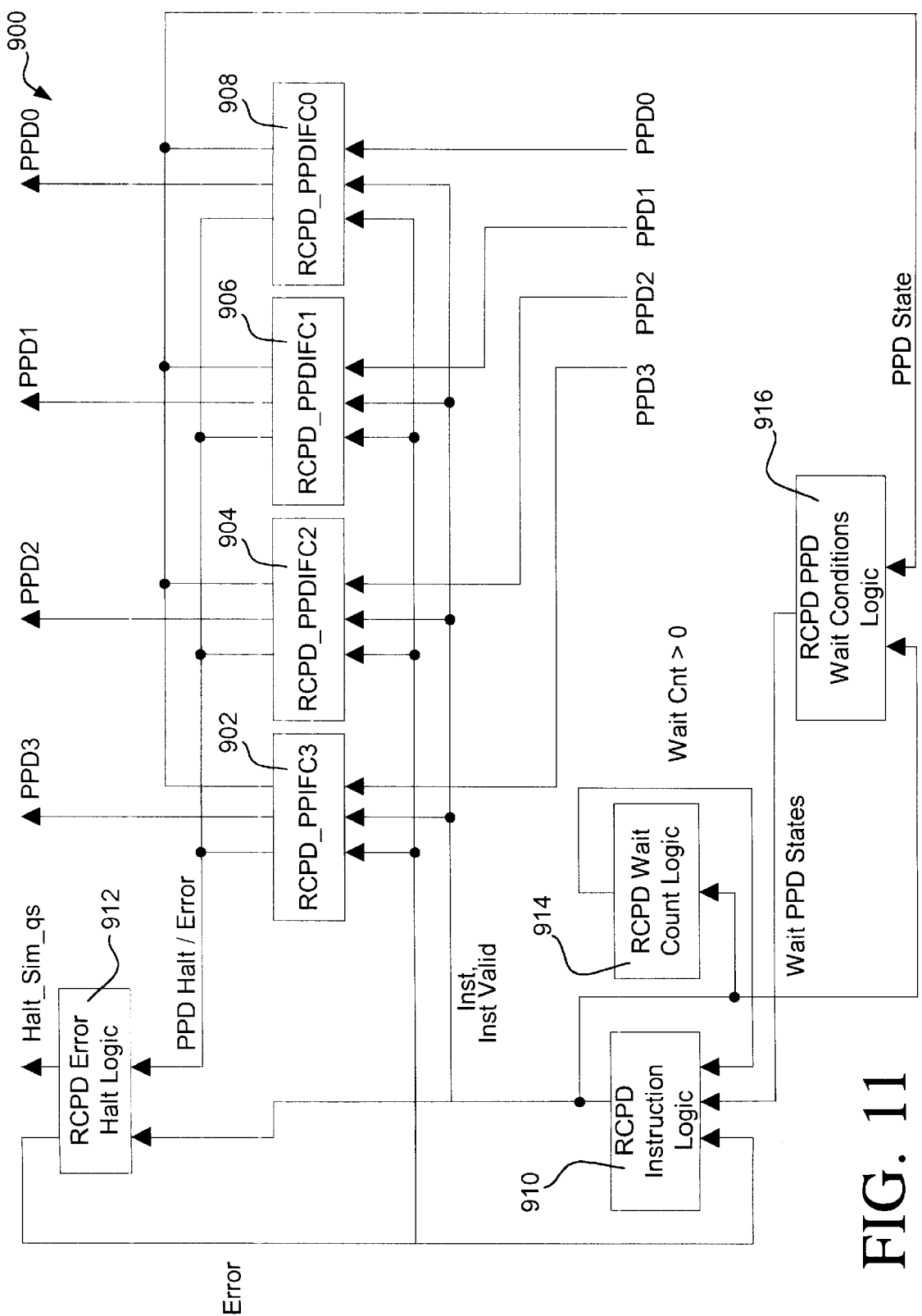
FIG. 11 is a block diagram of the RCPD.

FIG. 11 is a block diagram of an illustrative RCPD. The block diagram is generally shown at 900, and includes four RCPD_PPD_IF Blocks 902, 904, 906 and 908, an RCPD Instruction Block 910, an RCPD Error Halt Block 912, a Wait Count Block 914, and a PPD Wait Block 916. Each of the RCPD_PPD_IF Blocks 902, 904, 906, and 908 receives a number of signals from each of the four Port Drivers, along with selected signals from the RCPD Instruction Block 910 and the RCPD Error Halt Block 912. Each of the RCPD_PPD_IF Blocks 902, 904, 906 and 908 also provides a number of signals to each of the four Port Drivers, the RCPD Error Halt Block 912, and the PPD Wait Block 916. The signals provided by each of the RCPD_PPD_IF Blocks 902, 904, 906, and 908 to each Port Driver include the rcpd_run signal, the rcpd_step signal, the rcpd_hldpd signal, and the rcpd_hldr signal. The signals provided to each of the RCPD_PPD_IF Blocks 902, 904, 906, and 908 from each Port Driver include the ppd-active signal, the ppd_halt signal, and the ppd_error signal (see FIG. 8).

The RCPD Instruction Block 910 controls the sequence of RCPD instruction execution. The RCPD Instruction Block 910 may include a control RAM for storing a RCPD test list that includes a number of RCPD instructions. Execution of the RCPD instructions may provide the control signals needed to start, stop, and/or selectively synchronize each Port Driver via the four RCPD_PPD_IF Blocks 902, 904, 906, and 908. The Wait Count Block 914 helps control when selected RCPD instructions are executed. The PPD Wait Block 916 causes the RCPD to wait until the Port Drivers reach a state required by the current RCPD instruction.

Figure 12:
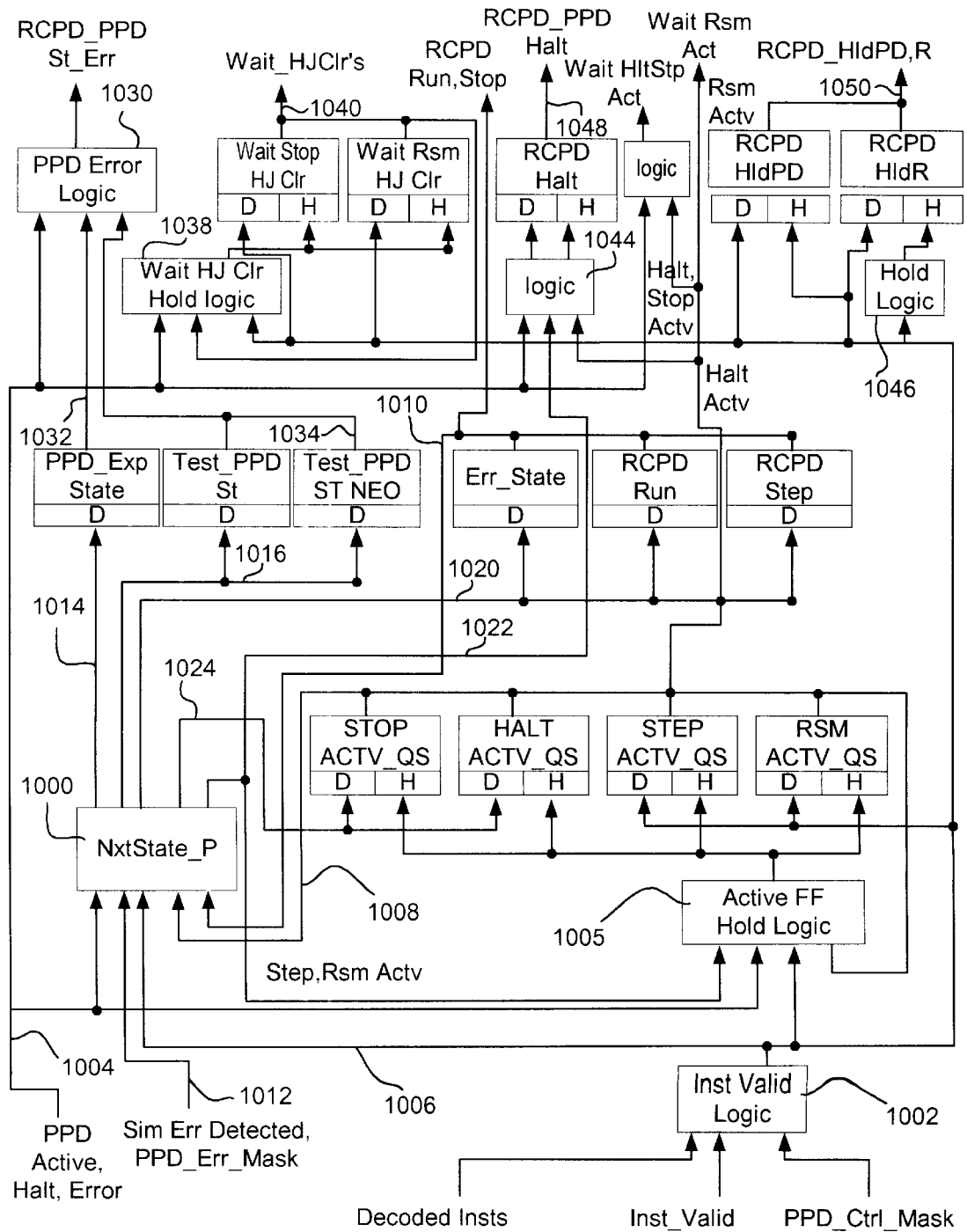
FIG. 12 is a block diagram of the RCPD-Port Driver Interface Block of FIG. 11.

FIG. 12 is a block diagram of one of the RCPD_PPD_IF Blocks of FIG. 11. The Next State Block 1000 is a state machine that controls the overall flow of the RCPD_PPD_IF Block. The Next State Block 1000 receives the ppd_active signal, ppd_halt signal, and ppd_error signal provided by the corresponding Port Driver via Interface 1004. The Next State Block 1000 also receives other signals including signals from the Instruction Valid Block 1002 via Interface 1006, step, resume, stop, and halt operation active signals via Interface 1008, and a number of current signal values including the current rcpd_run signal, the current rcpd_step signal, and the current err-state signal via Interface 1010. Finally, the Next State Block 1000 receives a sim_err signal and a ppd_err_mask signal via Interface 1012.

Based on the current state of the RCPD and current state of the corresponding Port Driver, the Next State Block 1000 produces a Next state through a number of control signals. The Next state is preferably produced in accordance with the state diagram shown in FIG. 13 below. Control signals produced by the Next State Block may include an expected Port Driver state signal via Interface 1014; two state test enable signals via Interface 1016; a next rcpd_run signal, a rcpd_step signal, and an err-state signal via Interface 1020; a stop and a halt active signal on Interface 1024; and a rcpd_halt_clr signal on Interface 1022.

The Instruction Valid Block 1002 receives a decoded instruction, an instruction valid, and a PPD control mask signal from the RCPD Instruction Block 910 (see FIG. 10). The Instruction Valid Block 1002 provides selected signals to the Next State Block 1000, the Active FF Hold Logic 1005, and other blocks as indicated.

A PPD Error Block 1030 receives the ppd_active, ppd_halt, and ppd_error signals via Interface 1004, along with the expected Port Driver state signal via Interface 1032, and the two state test enable signals via Interface 1034. The PPD Error Block 1030 asserts a RCPD_PPD state error signal if the current Port Driver state does not equal the expected Port Driver state.

The WAIT HJ CLR Block 1038 helps provide instruction control through the Wait Halt Jump Clear Signal 1040. The rcpd_ppd_Halt Signal 1048 is a source to the halt logic that helps indicate when the simulation is complete and is provided by Logic Block 1044. The RCPD_HLDD,R signals are generated using signals provided by the Instruction Valid Logic Block 1002 and Hold Logic Block 1046, as shown.

Figure 13:
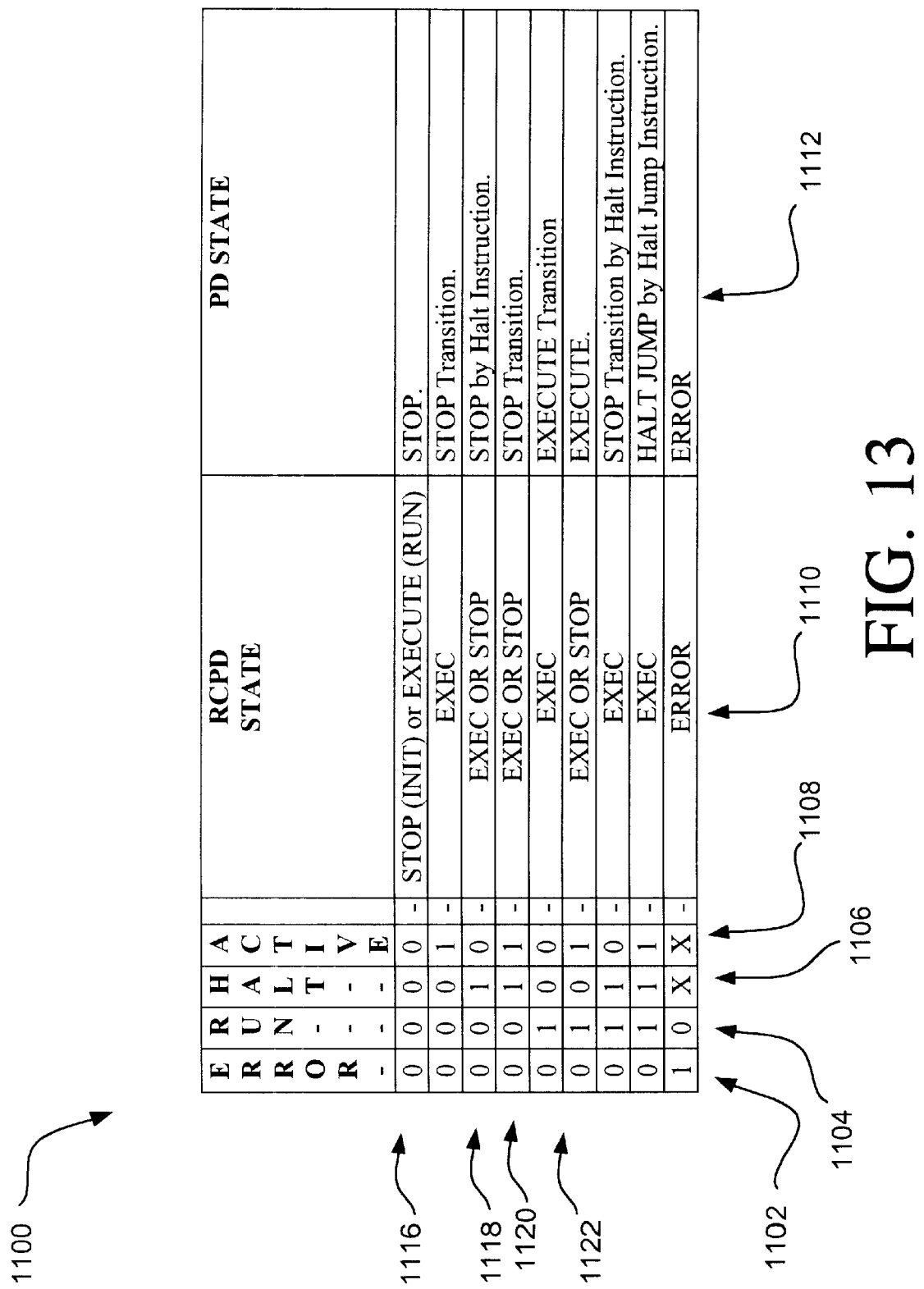
FIG. 13 is a table showing the state transitions for the RCPD and Port Driver under various signal conditions.

FIG. 13 is a table showing the state transitions for the RCPD and Port Driver under various conditions. The table is generally shown at 1100. The first, second, third, and fourth columns 1102, 1104, 1106, and 1108 recite all state combinations of the signals ppd_error, rcpd_run, ppd_halt, and ppd_active, respectively. The sixth column 1110 lists the expected RCPD state for each of the state combinations listed in the first four columns. The seventh column 1112 lists the expected Port Driver state for each of the state combinations listed in the first four columns.

In the first state combination 1116, the RCPD is initially in the Stop state. However, the RCPD could be in the Execute state during program execution. In the third, forth, and sixth state combinations 1118, 1120, and 1122, respectively, the RCPD state could be in either the Execute or Stop state.

FIG. 14 is a state diagram for the Port Driver. As indicated above, the Port Drivers are under at least partial control of the RCPD. Each Port Driver can have one of four states including Stop, Execute, Halt Jump, and Error.

Each Port Driver assumes the Stop state after initialization. Also, each Port Driver is placed in the Stop state when selected by the control mask of a RCPD Stop instruction or when a PPD Halt instruction is executed. The Stop state allows the RCPD to start and/or restart the Port Driver by simply executing a RCPD Start instruction. Note, however, if the Stop state was reached by executing a Port Driver Halt instruction, the Port Driver will assert the corresponding ppd_halt signal, preventing the Port Driver from being restarted by the RCPD.

The Error state is the state in which the Port Drivers and the RCPD are left when an error is detected by any of the Port Drivers. A mechanism to mask detection of this error may be provided in the Port Driver hardware to prevent the errors from stopping the simulation when faults are injected for the purpose of testing the different error detection mechanisms (e.g. fault injection).

When an error occurs unexpectedly, it is often advantageous to freeze the state of the Port Drivers. Therefore, when an error is detected by any Port Driver, an error signal is sent to the RCPD, which in turn de-asserts the rcpd_run signal to all Port Drivers, causing the Port Drivers to stop issuing instructions. The RCPD also asserts the error_stop signal, which indicates to the SRTC (see FIG. 8) to stop the simulation. This state can only be changed by re-initializing the Port Drivers and RCPD.

In the Execute state, the Port Driver fetches and executes instructions from its corresponding test list. The Port Driver changes from the Execute state to the Halt Jump state when the Port Driver executes a Halt Jump Instruction. If the Port Driver executes a Halt or the RCPD executes a Halt PPD instruction with the corresponding Port Driver selected in the control mask, the Port Driver goes to the Stop state. Also, the execution of a RCPD Stop instruction brings the Port Driver to the Stop state. If the RCPD executes a Start instruction selecting a Port Driver in an Execute state, the state remains unchanged.

The Halt Jump state results when a Port Driver executes a Halt-Jump instruction and before receiving a Resume or Step command from the RCPD. If the RCPD wishes to do a Resume or Step command and the Port Driver is not in the Halt Jump state, the RCPD will wait until the Halt Jump state is reached. All other RCPD instructions are ignored in this state. An error condition, however, will cause a transition from the Halt Jump state to the Error state.

Figure 15:
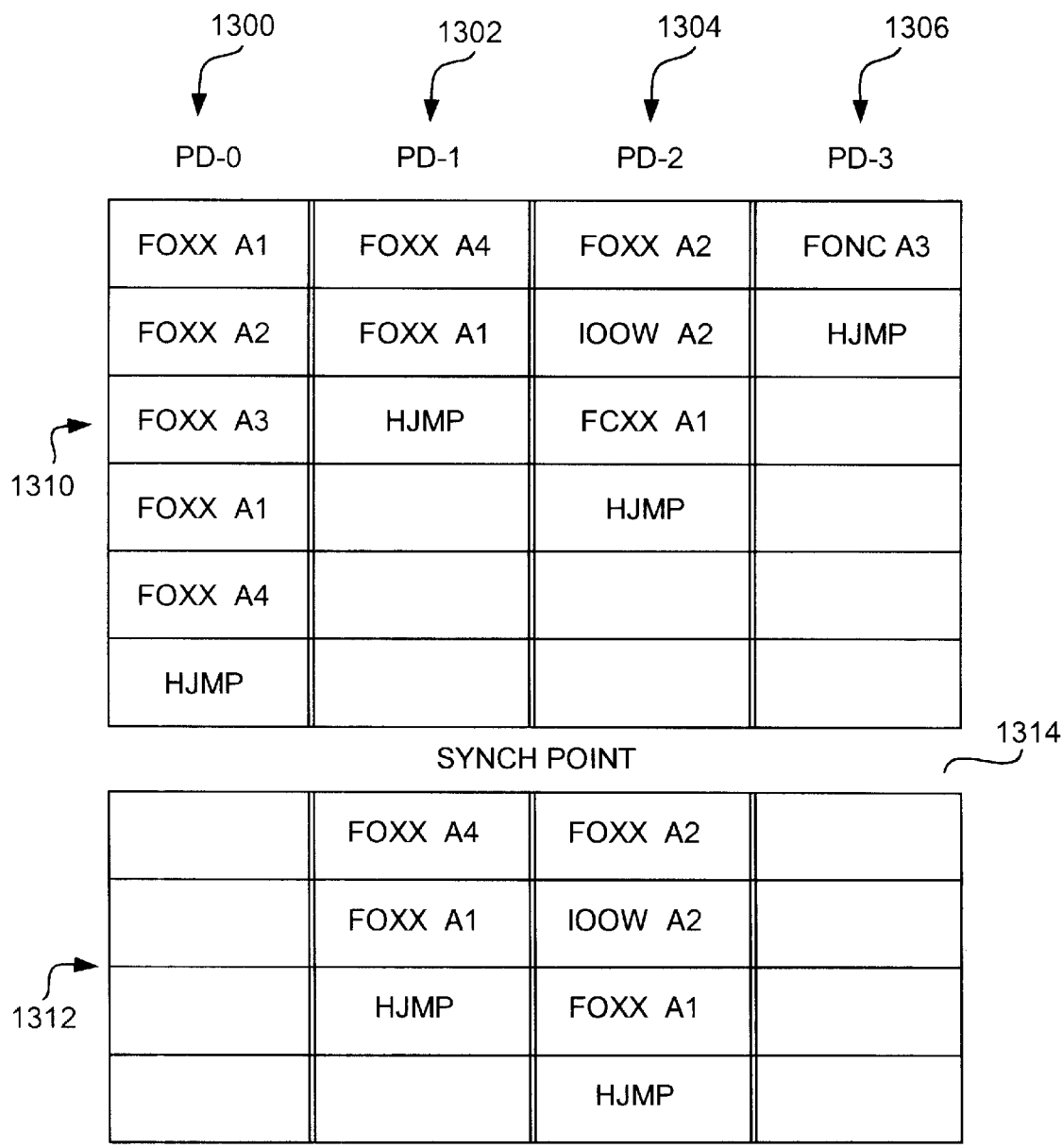
FIG. 15 is a diagram showing the synchronization of selected Port Driver test lists at desired synchronization points, while still allowing the Port Driver test lists to execute in a non-deterministic manner between the synchronization points.

FIG. 15 is a diagram showing the synchronization of selected Port Driver test lists at desired synchronization points, while allowing the Port Driver test lists to execute in a non-deterministic manner between the synchronization points. A first Port Driver test list is shown at 1300. A second Port Driver test list is shown at 1302. A third Port Driver test list is shown at 1304. A fourth Port Driver test list is shown at 1306.

In the illustrative diagram, two primary test cases 1310 and 1312 are shown with a synchronization point 1314 therebetween. The first test case 1310 activates each of the four Port Drivers 0–3, causing each of the four corresponding test lists 1300, 1302, 1304, and 1306 to be executed in a relatively non-deterministic manner. Note that during the first test case 1310, none of the Port Drivers 0–3 remain idle, indicating that the RCPD start instruction that initiated the first test case 1310 included a control mask that selected all four Port Drivers 0–3.

The second test case 1312 is executed when the RCPD detects that all four Port Drivers 0–3 have reached the Halt Jump state and no outstanding jobs remain pending. In the diagram shown, the second test case 1312 only activates Port Drivers 1–2, indicating that the RCPD resume instruction that initiated the second test case 1312 included a control mask that only selected Port Drivers 1–2.

As can be seen, each of the Port Drivers is preferably controlled by a separate and independently executing test list. Further, the test lists are preferably only synchronized at selected synchronization points, such as Synchronization Point 1314. In the illustrative diagram, the synchronization points are designated by including a HJMP instruction in one or more of the Port Driver Test Lists. For example, each of test lists 1300, 1302, 1304, and 1306 include a HJMP instruction at the desired synchronization point. The HJMP instruction causes the corresponding Port Drivers to stop reading new FA instructions and waiting until all outstanding requests are completed (all stacked requests sent and all expected responses received). Once all outstanding requests are completed, each Port Driver enters the Halt Jump state (ppd_active is set, ppd_halt is set). Since each Port Driver operates relatively independently from the others, the Port Drivers may enter the Halt Jump state at different times.

Once the RCPD detects the HJMP state from each of the Port Drivers selected by the source mask, Synchronization Point 1314 has been reached. Thereafter, the RCPD can initiate the next test case by activating those Port Drivers that are selected by the control mask of the resume instruction that is currently active. In the diagram shown, only Port Drivers 1–2 are activated by the RCPD.

Having thus described the preferred embodiments of the present invention, those of skill in the art will readily appreciate that yet other embodiments may be made and used within the scope of the claims hereto attached.

What is claimed is:

1. A method for performing logic simulation of a circuit design, the method comprising the steps of:
   providing two or more test lists for exercising the circuit design;
   synchronizing the execution of the two or more test lists at desired synchronization points, while allowing the two or more test lists to execute in a non-deterministic manner between the synchronization points, selected test lists having at least one statement for causing the test list to stop execution at a desired synchronization point, the synchronization points being selected to maintain a desired timing relationship between selected test lists so that a desired logic simulation result is achieved.

2. A method for synchronizing the execution of two or more test lists at desired synchronization points during the simulation of a circuit, the synchronization points being selected to maintain a desired timing relationship between selected test lists so that a desired logic simulation result is achieved, the circuit being stimulated by one or more test drivers where each test driver can assume two or more states, each test list exercising at least part of a corresponding one of the test drivers, the method comprising the steps of:
   executing each of a first set of the two or more test lists in a non-deterministic manner;
   monitoring the state of selected ones of the one or more test drivers, and detecting when each of the selected test drivers assume a first state; and
   halting the execution of each of the first set of test lists as each corresponding test driver assume the first state.

3. A method according to claim 2, further comprising the step of:
   resuming execution of each of a second set of the two or more test lists once all of the first set of test lists have been successfully halted.

4. A method according to claim 3, wherein the first set of test lists and the second set of test lists include at least one common test list.

5. A method according to claim 2, wherein selected ones of the two or more test lists have one or more synchronization commands, wherein a first type of synchronization command causes the corresponding test driver to assume the first state.

6. A method according to claim 5, wherein the first type of synchronization command is a halt command, and the first state is a halt state.

7. A method according to claim 2, wherein each of the one or more test lists includes a number of instructions, said halting step halting execution of new test list instructions, but allowing pending test list instructions to be completed.

8. A data processing system for performing logic simulation on a circuit design, the data processing system comprising:
   storing means for storing two or more test lists that when executed exercise the circuit design; and
   synchronizing means coupled to the circuit design and simulated along with the circuit design, said synchronizing means synchronizing the execution of the two or more test lists at desired synchronization points, while allowing the two or more test lists to execute in a non-deterministic manner between the synchronization points, selected test lists having at least one statement for causing the test list to stop execution at a desired synchronization point, the synchronization points being selected to maintain a desired timing relationship between selected test lists so that a desired logic simulation result is achieved.

9. A data processing system according to claim 8, wherein the synchronizing means includes a run control port driver.

10. A data processing system for synchronizing the execution of two or more test lists at desired synchronization points during the simulation of a circuit, the synchronization points being selected to maintain a desired timing relationship between selected test lists so that a desired logic simulation result is achieved, the circuit being stimulated by one or more test drivers with each test driver having one or more states, each test list exercising at least part of a corresponding one of the test drivers, the data processing system comprising:
    executing means for executing each of a first set of the two or more test lists in a non-deterministic manner;
    monitoring means coupled to said executing means for monitoring the state of selected ones of the one or more test drivers, and to detect when each of the selected test drivers assume a first state; and
    halting means coupled to said executing means and said monitoring means for halting the execution of each test list as each corresponding test driver assume the first state.

11. A data processing system according to claim 10, further comprising:
    resuming means for resuming execution of each of a second set of the two or more test lists once all of the first set of test lists have been halted by said halting means.

12. A data processing system according to claim 11, wherein the first set of test lists and the second set of test lists include at least one common test list.

13. A data processing system according to claim 10, wherein selected test lists have one or more synchronization commands, wherein a first type of synchronization command causes the corresponding test driver to assume the first state.

14. A method according to claim 13, wherein the first type of synchronization command is a halt command, and the first state is a halt state.

15. A run control port driver for synchronizing two or more port drivers that interface with corresponding ports of a multi-port memory module, each of the selected port drivers controlled at least in part by a corresponding test list, the run control port driver comprising:
    interface means for providing an interface between the run control port driver and each of the port drivers; and
    controller means for synchronizing the execution of a first set of port drivers at desired synchronization points, while allowing the first set of port drivers to execute in a non-deterministic manner between the synchronization points, the synchronization points being selected to maintain a desired timing relationship between selected test lists so that a desired logic simulation result is achieved.

16. A run control port driver according to claim 15, wherein at least some of the test lists include one or more commands including a first synchronizing command, said controller means allowing each of the port drivers in the first set of port drivers to execute the one or more commands in the corresponding test list until the first synchronization command is detected, said controller means halting the corresponding port driver when the first synchronization command is detected.

17. A run control port driver according to claim 16, wherein said controller means allows each of a second set of the port drivers to resume execution once all of the first set of port drivers have been halted by said controller means as a result of detecting a corresponding first synchronization command.

18. A run control port driver according to claim 17, wherein the first set of port drivers are identified by a first control mask.

19. A run control port driver according to claim 18, wherein the second set of port drivers are identified by a second control mask.

20. A run control port driver according to claim 18, wherein the run controller port driver provides a run controller port driver command to each port driver, the run controller port driver command including selected fields that correspond to the first control mask.

\* \* \* \* \*